United States Patent
Yamano

(10) Patent No.: US 7,875,499 B2
(45) Date of Patent: Jan. 25, 2011

(54) METHOD OF MANUFACTURING A STACKED SEMICONDUCTOR APPARATUS

(75) Inventor: Takaharu Yamano, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 0 days.

(21) Appl. No.: 12/588,076

(22) Filed: Oct. 2, 2009

(65) Prior Publication Data

US 2010/0022035 A1 Jan. 28, 2010

Related U.S. Application Data

(62) Division of application No. 12/238,699, filed on Sep. 26, 2008.

(30) Foreign Application Priority Data

Sep. 27, 2007 (JP) ............................. 2007-250804

(51) Int. Cl.
 H01L 21/00 (2006.01)
 H01L 21/50 (2006.01)
 G01R 31/28 (2006.01)
 H01L 23/538 (2006.01)

(52) U.S. Cl. ............... 438/109; 257/777; 257/E21.499; 257/E21.53; 438/15

(58) Field of Classification Search ................. 257/777; 438/15, 109
See application file for complete search history.

(56) References Cited

U.S. PATENT DOCUMENTS

2004/0104473 A1  6/2004 Farnworth
2004/0191955 A1  9/2004 Joshi et al.
2005/0017326 A1* 1/2005 Iijima et al. .................. 257/620
2005/0093167 A1* 5/2005 Saeki ........................ 257/774
2005/0104228 A1  5/2005 Rigg et al.
2005/0212109 A1* 9/2005 Cherukuri et al. ........... 257/686
2006/0091518 A1  5/2006 Grafe et al.
2006/0223231 A1* 10/2006 Koiwa et al. ................ 438/108

FOREIGN PATENT DOCUMENTS

| EP | 1 032 041 A2 | 8/2000 |
|---|---|---|
| JP | 2001-127256 | 5/2001 |
| JP | 2001-298150 | 10/2001 |
| JP | 2005-302871 | 10/2005 |
| JP | 2007-005800 | 1/2007 |
| WO | WO 2004/049436 A1 | 6/2004 |
| WO | WO 2004049436 A1 * | 6/2004 |
| WO | WO 2006/037056 A2 | 4/2006 |

* cited by examiner

*Primary Examiner*—Marcos D Pizarro
*Assistant Examiner*—Raj Gupta
(74) *Attorney, Agent, or Firm*—Drinker Biddle & Reath LLP

(57) ABSTRACT

There are provided a plurality of semiconductor apparatuses judged as good items in electrical and functional inspections while having internal connection terminals disposed on electrode pads of semiconductor chips, resin layers which are disposed on surfaces of the semiconductor chips in which the electrode pads are formed and expose the internal connection terminals, and wiring patterns which are disposed on the resin layers and are connected to the internal connection terminals, a wiring substrate on which the plurality of semiconductor apparatuses are stepwise stacked, the wiring substrate electrically connected to the plurality of semiconductor apparatuses, and a sealing resin with which the plurality of semiconductor apparatuses are sealed.

2 Claims, 23 Drawing Sheets

METHOD OF MANUFACTURING A STACKED SEMICONDUCTOR APPARATUS

This is a divisional application of application Ser. No. 12/238,699, filed on Sep. 26, 2008, which is incorporated by reference herein in its entirety.

TECHNICAL FIELD

The present disclosure relates to an electronic apparatus and a manufacturing method thereof, and relates to an electronic apparatus comprising a plurality of semiconductor chips stacked on a wiring substrate and a sealing resin with which the plurality of semiconductor chips are sealed, and a manufacturing method of the electronic apparatus.

RELATED ART

FIG. 1 is a sectional diagram of a related-art electronic apparatus.

Referring to FIG. 1, a related-art electronic component 200 has a wiring substrate 201, semiconductor chips 202 to 204, a sealing resin 205 and external connection terminals 206.

The wiring substrate 201 has a core substrate 211, through vias 212, pads 213, 216, and solder resists 214, 217.

The core substrate 211 is a substrate formed in a plate shape and has through holes 219. The through vias 212 are disposed in the through holes 219. The upper end of the through via 212 is connected to the pad 213 and the lower end of the through via 212 is connected to the pad 216. The pad 213 is disposed on an upper surface 211A of the core substrate 211. The pad 213 is connected to the upper end of the through via 212. The pad 213 is connected to a metal wire 222 electrically connected to the semiconductor chip 202.

The solder resist 214 is disposed on the upper surface 211A of the core substrate 211 so as to expose the pad 213. The pad 216 is disposed on a lower surface 211B of the core substrate 211. The pad 216 is connected to the lower end of the through via 212. The external connection terminal 206 is disposed on the pad 216. The solder resist 217 is disposed on the lower surface 211B of the core substrate 211 so as to expose the pad 216.

The semiconductor chip 202 has a semiconductor substrate 226, a semiconductor integrated circuit 227, electrode pads 228 and a protective film 229. The semiconductor integrated circuit 227 is disposed on the upper surface side of the semiconductor substrate 226. The electrode pad 228 is disposed on the semiconductor integrated circuit 227 and is electrically connected to the semiconductor integrated circuit 227. The metal wire 222 connected to the pad 213 of the wiring substrate 201 is connected to the electrode pad 228. Consequently, the semiconductor chip 202 is electrically connected to the wiring substrate 201. The protective film 229 is disposed on the semiconductor integrated circuit 227 so as to expose the electrode pads 228. The semiconductor chip 202 constructed above is a chip in which a short open test is passed. However, the semiconductor chip 202 is a chip in which a functional inspection (concretely, an action check of the semiconductor integrated circuit 227 disposed in the semiconductor chip 202 (for example, a check of the presence or absence of a reading error)) is not made. That is, the semiconductor chip 202 is not a KGD (Known Good Die). The semiconductor chip 202 is glued on the solder resist 214 of the wiring substrate 201 by a sticky layer 232 stuck on a lower surface of the semiconductor substrate 226.

The semiconductor chip 203 has a semiconductor substrate 234, a semiconductor integrated circuit 235, electrode pads 236 and a protective film 237. The semiconductor integrated circuit 235 is disposed on the upper surface side of the semiconductor substrate 234. The electrode pad 236 is disposed on the semiconductor integrated circuit 235 and is electrically connected to the semiconductor integrated circuit 235. A metal wire 223 connected to the electrode pad 228 of the semiconductor chip 202 and a metal wire 224 connected to an electrode pad 244 of the semiconductor chip 204 are connected to the electrode pad 236. Consequently, the semiconductor chip 203 is electrically connected to the semiconductor chips 202, 204. The protective film 237 is disposed on the semiconductor integrated circuit 235 so as to expose the electrode pads 236. The semiconductor chip 203 constructed above is a chip in which a short open test is passed. However, the semiconductor chip 203 is a chip in which a functional inspection (concretely, an action check of the semiconductor integrated circuit 235 disposed in the semiconductor chip 203 (for example, a check of the presence or absence of a reading error)) is not made. That is, the semiconductor chip 203 is not a KGD (Known Good Die). The semiconductor chip 203 is glued on the protective film 229 of the semiconductor chip 202 by a sticky layer 232 stuck on a lower surface of the semiconductor substrate 234.

The semiconductor chip 204 has a semiconductor substrate 242, a semiconductor integrated circuit 243, electrode pads 244 and a protective film 245. The semiconductor integrated circuit 243 is disposed on the upper surface side of the semiconductor substrate 242. The electrode pad 244 is disposed on the semiconductor integrated circuit 243 and is electrically connected to the semiconductor integrated circuit 243. The metal wire 224 connected to the electrode pad 236 of the semiconductor chip 203 is connected to the electrode pad 244. Consequently, the semiconductor chip 204 is electrically connected to the semiconductor chip 203. The protective film 245 is disposed on the semiconductor integrated circuit 243 so as to expose the electrode pads 244. The semiconductor chip 204 constructed above is a chip in which a short open test is passed. However, the semiconductor chip 204 is a chip in which a functional inspection (concretely, an action check of the semiconductor integrated circuit 243 disposed in the semiconductor chip 204 (for example, a check of the presence or absence of a reading error)) is not made. That is, the semiconductor chip 204 is not a KGD (Known Good Die). The semiconductor chip 204 is glued on the protective film 237 of the semiconductor chip 203 by a sticky layer 232 stuck on a lower surface of the semiconductor substrate 242. As the semiconductor chips 202 to 204, for example, NAND type flash memory can be used.

The sealing resin 205 is disposed on the wiring substrate 201 so as to seal the stacked semiconductor chips 202 to 204 and the metal wires 222 to 224. As the sealing resin 205, for example, a molding resin having thermosetting properties can be used.

The external connection terminal 206 is arranged on the pad 216 of the wiring substrate 201. The external connection terminal 206 is a terminal electrically connected to a mounting substrate (not shown) such as a motherboard. As the external connection terminal 206, for example, a solder bump can be used.

FIGS. 2 to 7 are diagrams showing manufacturing steps of the related-art electronic apparatus. In FIGS. 2 to 7, the same numerals are assigned to the same components as those of the related-art electronic apparatus 200.

First, in a step shown in FIG. 2, a wiring substrate 201 is manufactured by a well-known technique. Next, in a step shown in FIG. 3, a plurality of semiconductor chips 202 to 204 are prepared. The plurality of semiconductor chips 202 to 204 are a semiconductor chip which is not a KGD (Known Good Die).

Then, in a step shown in FIG. 4, sticky layers 232 are stuck on lower surfaces of semiconductor substrates 226, 234, 242 disposed in the semiconductor chips 202 to 204. Then, in a step shown in FIG. 5, the semiconductor chips 202 to 204 on which the sticky layers 232 are formed are sequentially stacked on the wiring substrate 201 and thereafter, wire bonding connection between the wiring substrate 201 and the semiconductor chips 202 to 204 is made using metal wires 222 to 224.

Then, in a step shown in FIG. 6, the semiconductor chips 202 to 204 and the metal wires 222 to 224 are sealed with a sealing resin 205 (for example, a molding resin). Concretely, for example, the sealing resin 205 in a partially cured state is formed while applying a high pressure (for example, 5 MPa to 10 MPa) using a metal mold and thereafter, the sealing resin 205 in the partially cured state is heated (for example, 180° C.) and the sealing resin 205 is cured.

Then, in a step shown in FIG. 7, external connection terminals 206 (for example, solder bumps) are formed on pads 216 of the wiring substrate 201. Consequently, the electronic apparatus 200 is manufactured (for example, see Patent Reference 1).

[Patent Reference 1] Japanese Patent Unexamined Application Publication No. 2007-5800

However, in the related-art electronic apparatus 200, the semiconductor chips 202 to 204 which are not a KGD (Known Good Die) are stacked on the wiring substrate 201, so that there was a problem that a yield of the electronic apparatus 200 reduces.

Also, by stacking the semiconductor chips 202 to 204 on the wiring substrate 201 and thereafter forming the sealing resin 205 in a partially cured state while applying a high pressure (for example, 5 MPa to 10 MPa) using a metal mold and thereafter heating (for example, 180° C.) the sealing resin 205 in the partially cured state, the sealing resin 205 was cured and packaging processing was performed. As a result of that, due to influence of a high pressure or a high temperature, etc. in a step of formation of the sealing resin 205, the semiconductor chips 202 to 204 are broken and a yield of the electronic apparatus 200 reduces.

SUMMARY

Exemplary embodiments of the present invention provide an electronic apparatus capable of improving a yield of the electronic apparatus by stacking semiconductor chips on a wiring substrate after previously performing WLP packaging processing of each of the semiconductor chips and forming a KGD before a sealing resin formation step, and a manufacturing method of the electronic apparatus.

According to one standpoint of the invention, there is provided an electronic apparatus comprising:
  a plurality of semiconductor apparatuses, each of semiconductor apparatuses having a semiconductor chip having an electrode pad, an internal connection terminal disposed on the electrode pad, a resin layer which is disposed on a surface of the semiconductor chip in which the electrode pad is formed and expose the internal connection terminal, and a wiring pattern which is disposed on the resin layer and is connected to the internal connection terminal;
  a wiring substrate on which the plurality of semiconductor apparatuses are stacked, the wiring substrate electrically connected to the plurality of semiconductor apparatuses through the wiring patterns; and
  a sealing resin with which the plurality of semiconductor apparatuses stacked on the wiring substrate are sealed,
  wherein the plurality of semiconductor apparatuses are semiconductor apparatuses judged as good items in electrical and functional inspections made before being stacked on the wiring substrate.

According to the invention, a plurality of semiconductor apparatuses (KGD (Known Good Die)) judged as good items in electrical and functional inspections made before being stacked on a wiring substrate while having resin layers which are disposed surfaces of semiconductor chips in which electrode pads are formed and expose the internal connection terminals and wiring patterns which are disposed on the resin layers and are connected to the internal connection terminals are stacked on the wiring substrate and thereby, a yield of an electronic apparatus can be improved.

Also, since a high pressure or a high temperature, etc. at the time of forming the wiring pattern and the resin layer is applied to the semiconductor chips disposed in the plurality of semiconductor apparatuses judged as the good items before a sealing resin is formed. Consequently, the semiconductor chips disposed in the plurality of semiconductor apparatuses become resistant to breakage by influence of a pressure or a temperature, etc. at the time of forming the sealing resin (influence by a packaging processing process), so that a yield of the electronic apparatus can be improved.

According to another standpoint of the invention, there is provided a manufacturing method of an electronic apparatus comprising a plurality of semiconductor apparatuses, a wiring substrate on which the plurality of semiconductor apparatuses are stacked, and a sealing resin with which the plurality of semiconductor apparatuses stacked on the wiring substrate are sealed, the method comprising:
  a semiconductor apparatus formation step of forming the plurality of semiconductor apparatuses;
  a good item semiconductor apparatus acquisition step of making electrical and functional inspections of the plurality of semiconductor apparatuses and acquiring a plurality of semiconductor apparatuses judged as good items;
  a semiconductor apparatus stacking step of stacking the plurality of semiconductor apparatuses judged as the good items on the wiring substrate;
  an electrical connection step of making electrical connection between the wiring substrate and the plurality of semiconductor apparatuses judged as the good items after the semiconductor apparatus stacking step; and
  a sealing resin formation step of sealing the plurality of semiconductor apparatuses judged as the good items with the sealing resin after the electrical connection step.

According to the invention, electrical and functional inspections of a plurality of semiconductor apparatuses having resin layers which are disposed on surfaces of semiconductor chips in which electrode pads are formed and expose internal connection terminals and wiring patterns which are disposed on the resin layers and are connected to the internal connection terminals are made and the plurality of semiconductor apparatuses judged as good items are acquired and the plurality of semiconductor apparatuses (KGD (Known Good Die)) judged as the good items are stacked on the wiring substrate and then electrical connection between the wiring substrate and the stacked a plurality of semiconductor apparatuses are made and thereafter the plurality of semiconductor apparatuses are sealed with a sealing resin and thereby, a yield of an electronic apparatus can be improved.

Also, since a high pressure or a high temperature, etc. at the time of forming the wiring pattern and the resin layer is applied to the semiconductor chips disposed in the plurality of semiconductor apparatuses judged as the good items before the sealing resin is formed. Consequently, the semiconductor chips disposed in the plurality of semiconductor apparatuses become resistant to breakage by influence of a pressure or a temperature, etc. at the time of forming the sealing resin (influence by a packaging processing process), so that a yield of the electronic apparatus can be improved.

According to the invention, a yield of an electronic apparatus can be improved by preventing breakage of a semiconductor chip in a packaging processing process including a sealing resin formation step.

Other features and advantages may be apparent from the following detailed description, the accompanying drawings and the claims.

DETAILED DESCRIPTION

Next, an embodiment of the invention will be described based on the drawings.

Embodiment

Figure 1:
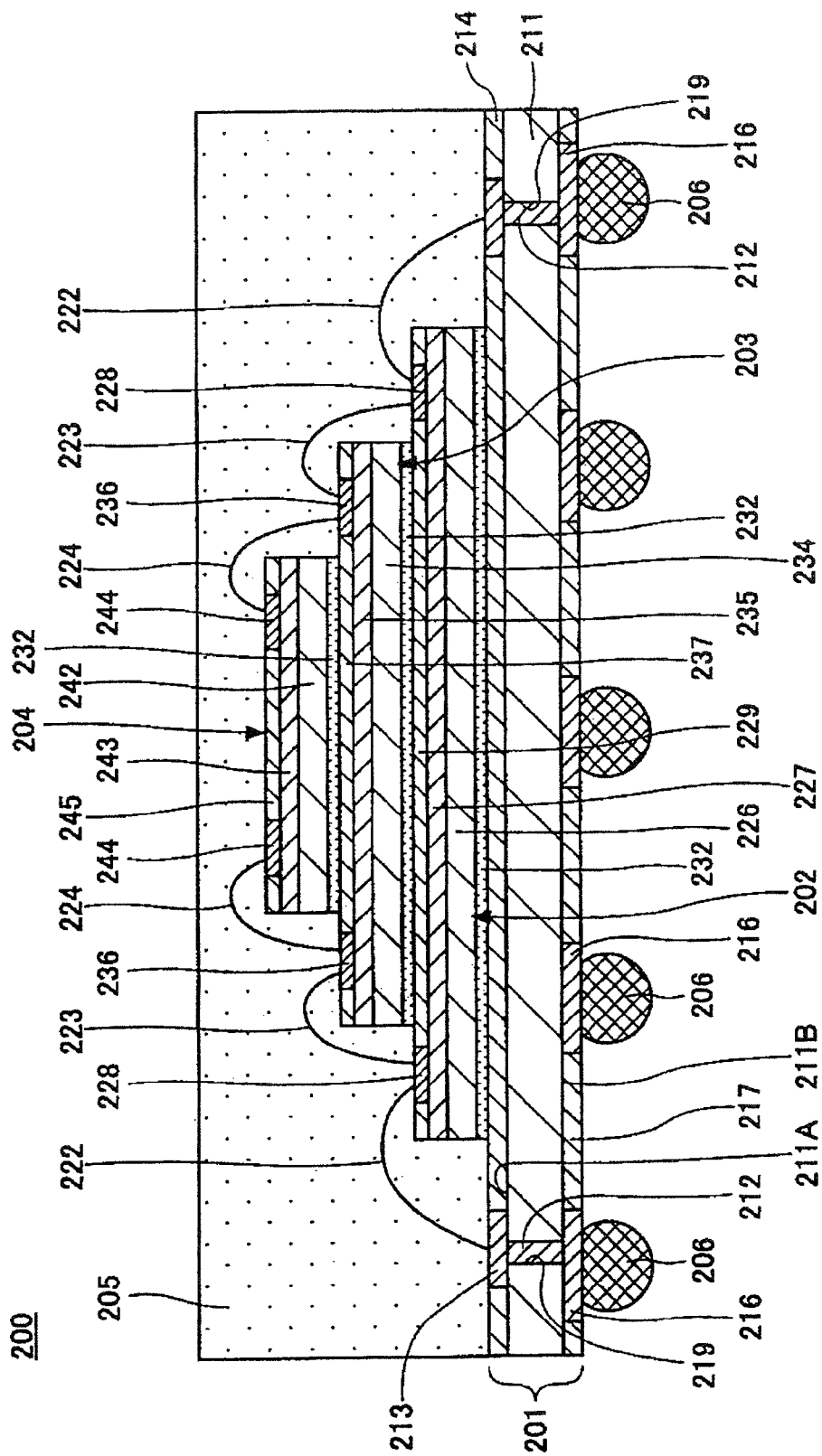
FIG. 1 is a sectional diagram of a related-art electronic apparatus.
Figure 2:
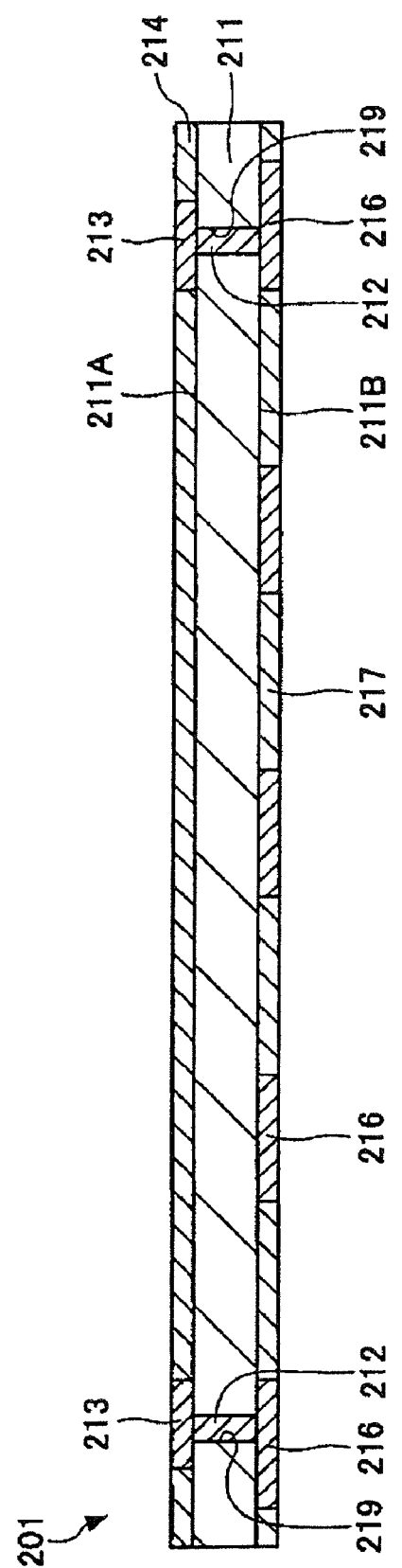
FIG. 2 is a diagram showing a manufacturing step of the related-art electronic apparatus (first).
Figure 3:
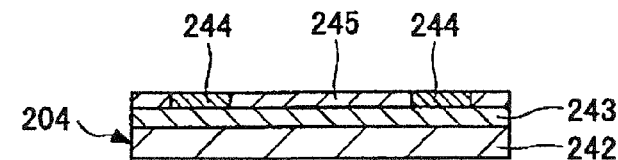
FIG. 3 is a diagram showing a manufacturing step of the related-art electronic apparatus (second).
Figure 3:
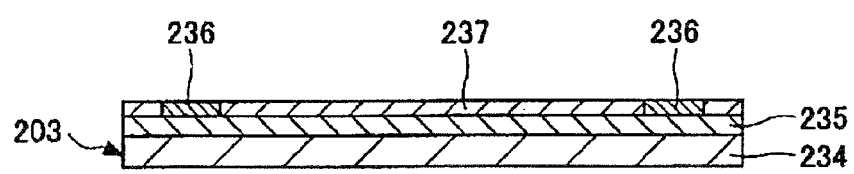
Figure 3:
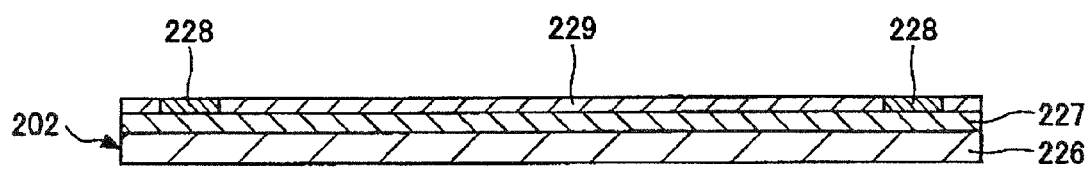
Figure 4:
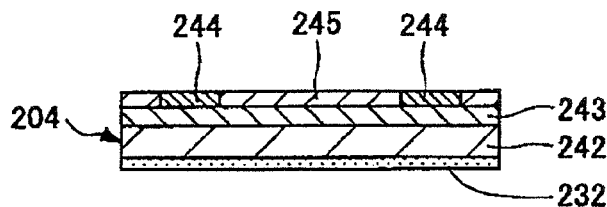
FIG. 4 is a diagram showing a manufacturing step of the related-art electronic apparatus (third).
Figure 4:
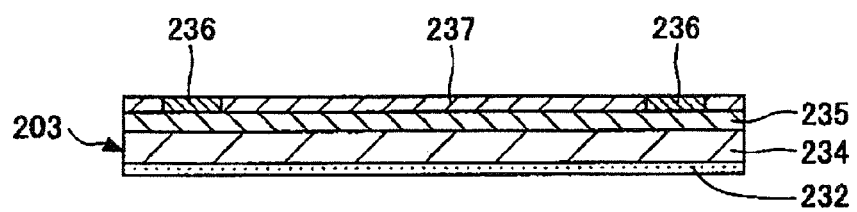
Figure 4:
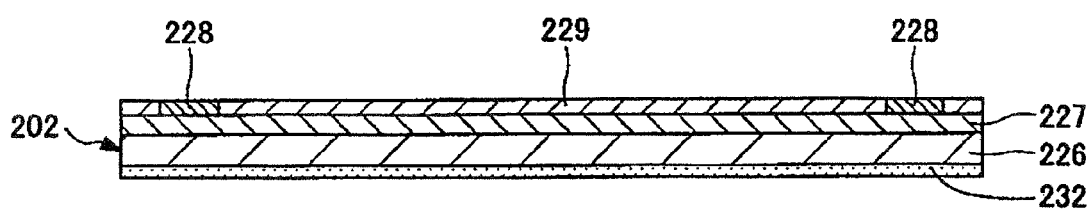
Figure 5:
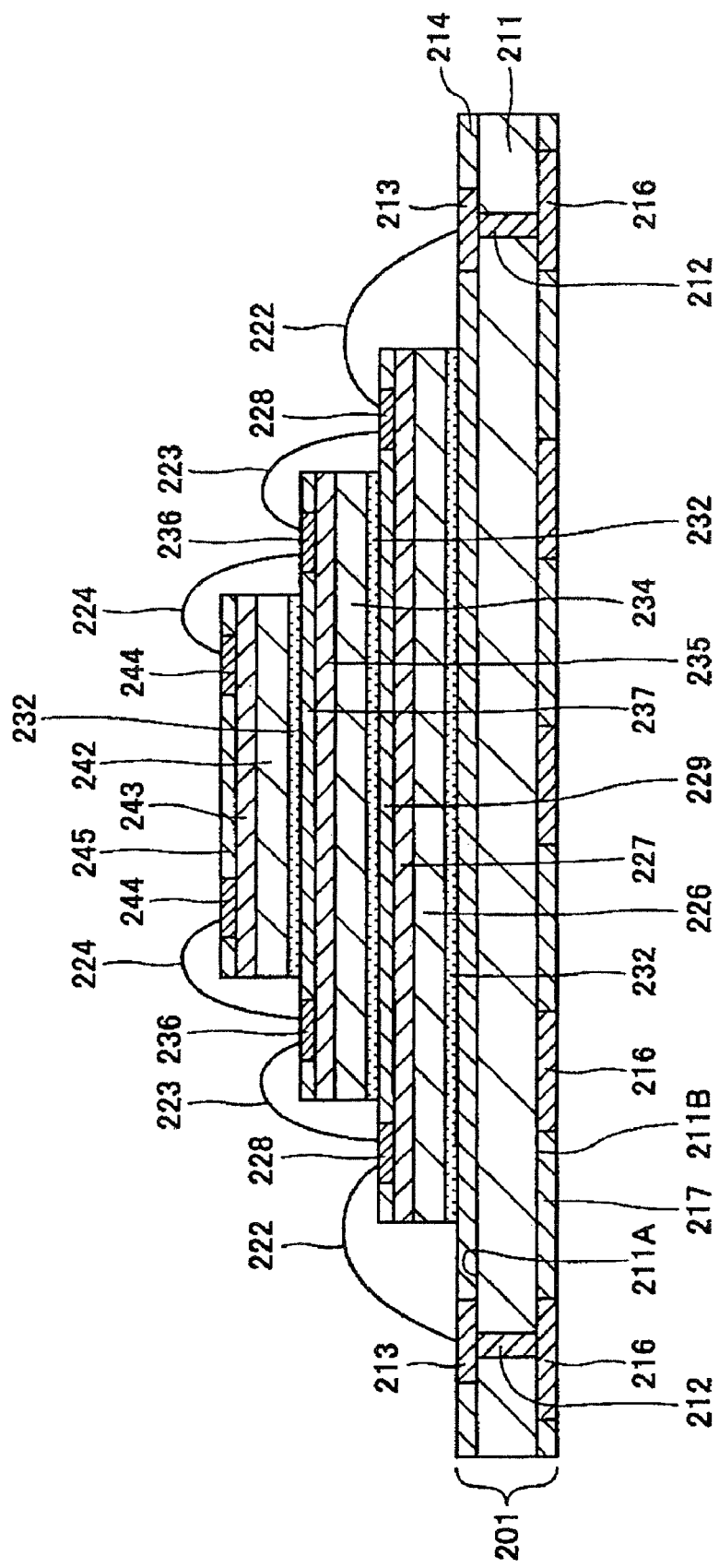
FIG. 5 is a diagram showing a manufacturing step of the related-art electronic apparatus (fourth).
Figure 6:
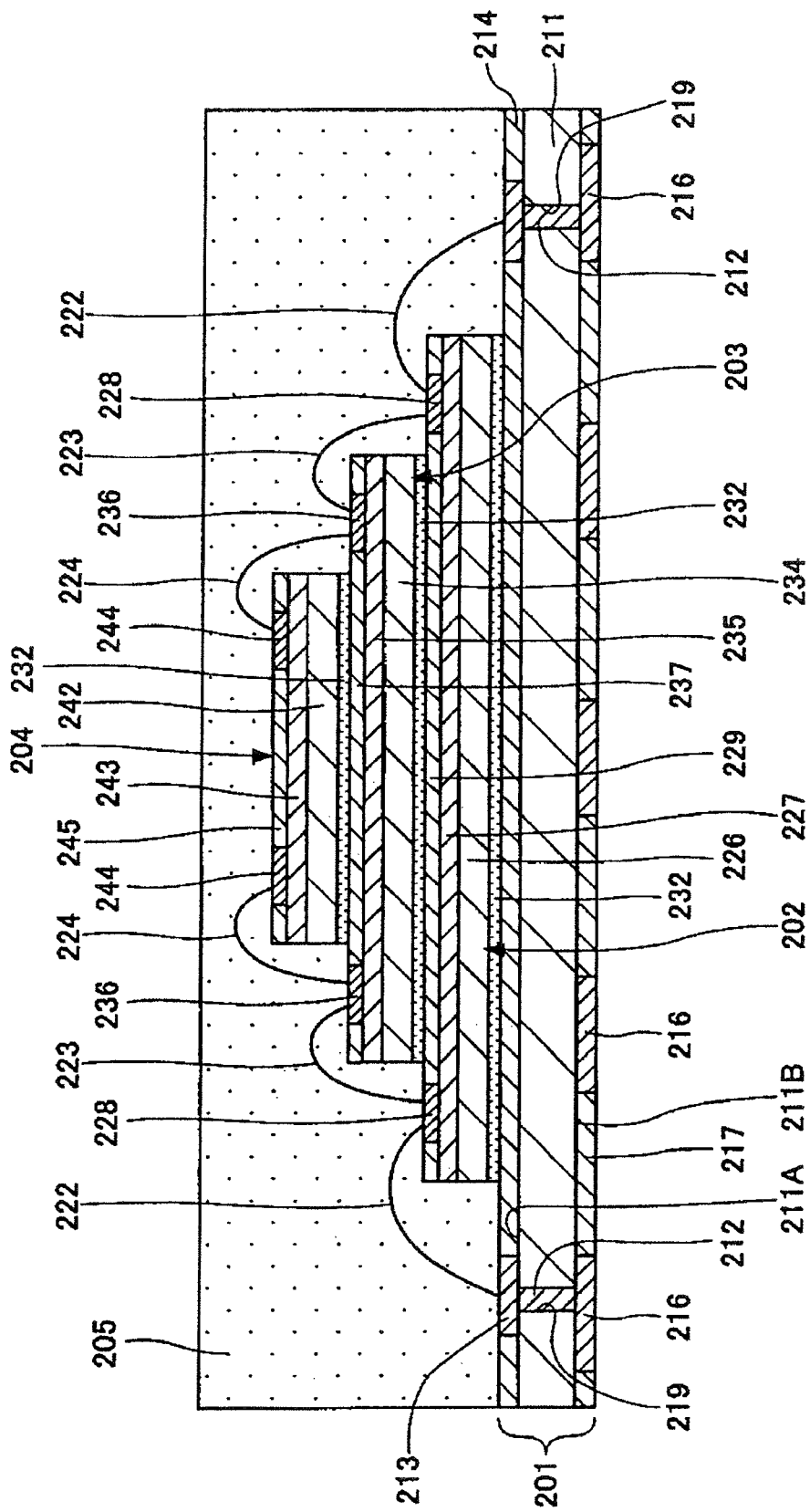
FIG. 6 is a diagram showing a manufacturing step of the related-art electronic apparatus (fifth).
Figure 7:
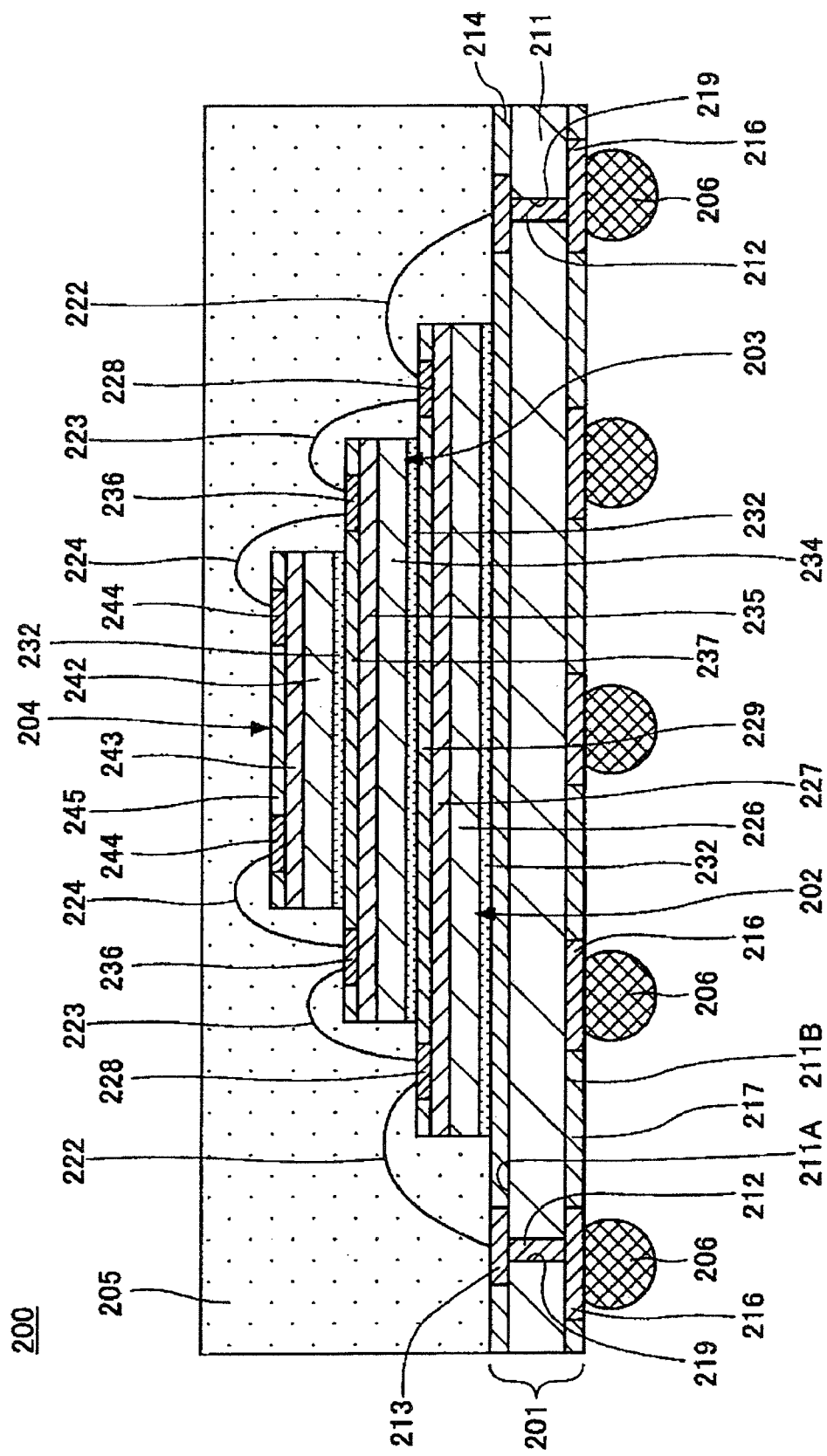
FIG. 7 is a diagram showing a manufacturing step of the related-art electronic apparatus (sixth).
Figure 8:
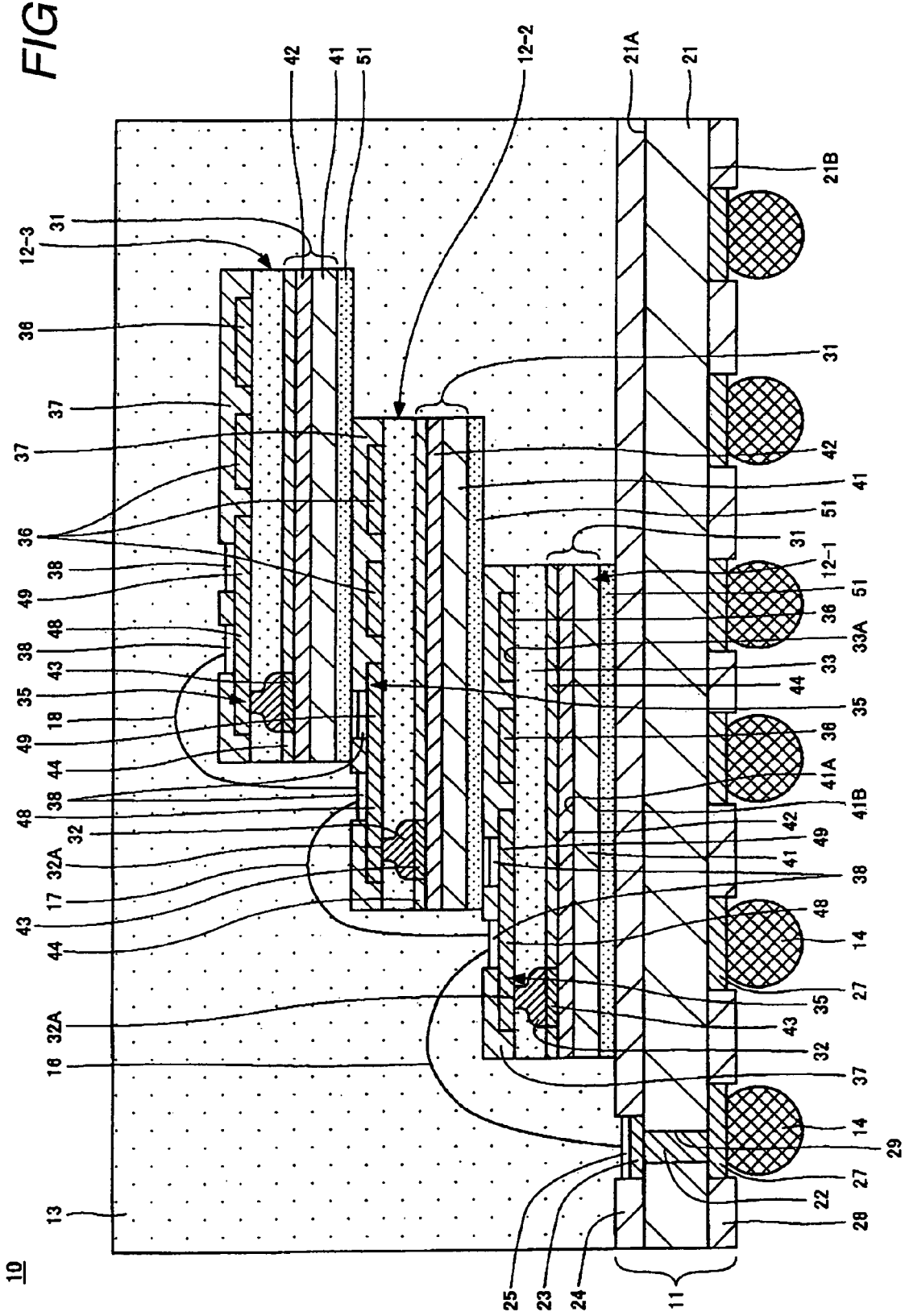
FIG. 8 is a sectional diagram of an electronic apparatus according to an embodiment of the invention.

FIG. 8 is a sectional diagram of an electronic apparatus according to an embodiment of the invention.

Referring to FIG. 8, an electronic apparatus 10 of the present embodiment has a wiring substrate 11, semiconductor apparatuses 12-1 to 12-3 which are a plurality of semiconductor apparatuses, a sealing resin 13 and external connection terminals 14.

The wiring substrate 11 has a core substrate 21, a through via 22, a pad 23, solder resists 24, 28, a diffusion preventive film 25 and pads 27 for external connection. The core substrate 21 is a substrate formed in a plate shape and has a through hole 29. As a material of the core substrate 21, for example, a glass epoxy resin or an FR-4 can be used. The through via 22 is disposed in the through hole 29. The upper end of the through via 22 is connected to the pad 23 and the lower end of the through via 22 is connected to the pad 27 for external connection. The through via 22 is a via for making electrical connection between the pad 23 and the pad 27 for external connection.

The pad 23 is disposed on an upper surface of the through via 22 and an upper surface 21A of the core substrate 21. The pad 23 is connected to the through via 22 and also is electrically connected to the semiconductor apparatus 12-1 through a metal wire 16 and the diffusion preventive film 25.

The solder resist 24 is disposed so as to cover the upper surface 21A of the core substrate 21. The solder resist 24 has an opening part for exposing an upper surface of the pad 23.

The diffusion preventive film 25 is disposed so as to cover the upper surface of the pad 23. The diffusion preventive film 25 is connected to the metal wire 16 electrically connected to the semiconductor apparatus 12-1. As the diffusion preventive film 25, for example, an Ni/Au film in which an Ni layer and an Au layer are sequentially provided on the pad 23 can be used.

The pad 27 for external connection is disposed on a lower surface of the through via 22 and a lower surface 21B of the core substrate 21. Consequently, the pad 27 for external connection is connected to the through via 22.

The solder resist 28 is disposed so as to cover the lower surface 21B of the core substrate 21. The solder resist 28 has an opening part for exposing a lower surface of the pad 27 for external connection.

The semiconductor apparatus 12-1 has a semiconductor chip 31, an internal connection terminal 32, a resin layer 33, a wiring pattern 35, dummy patterns 36, a solder resist 37 and a diffusion preventive film 38.

The semiconductor chip 31 has a semiconductor substrate 41, a semiconductor integrated circuit 42, an electrode pad 43 and a protective film 44. The semiconductor substrate 41 is a substrate formed in a plate shape. As the semiconductor substrate 41, for example, a silicon substrate can be used. In the case of using the silicon substrate as the semiconductor substrate 41, a thickness of the semiconductor substrate 41 can be set at, for example, 50 μm to 100 μm.

The semiconductor integrated circuit 42 is disposed on the side of an upper surface 41A of the semiconductor substrate 41. The semiconductor integrated circuit 42 is a circuit constructed by a diffusion layer, an insulating film, a via and wiring (not shown).

The electrode pad 43 is disposed on the semiconductor integrated circuit 42. The electrode pad 43 is electrically connected to the diffusion layer, the via and the wiring (all are not shown) disposed in the semiconductor integrated circuit 42.

The protective film 44 is disposed on the semiconductor integrated circuit 42 so as to expose the electrode pad 43. protective film 44 is a film for protecting the semiconductor integrated circuit 42. As the protective film 44, for example, an SiN film or a PSG film can be used. Also, a polyimide film may be formed on a film such as the SiN film or the PSG film.

The internal connection terminal 32 is disposed on the electrode pad 43. The internal connection terminal 32 is electrically connected to the semiconductor integrated circuit 42 through the electrode pad 43. An upper surface 32A of the internal connection terminal 32 is formed in substantially a flat surface and is connected to the wiring pattern 35. A height of the internal connection terminal 32 can be set at, for example, 10 μm to 60 μm. As the internal connection terminal 32, for example, an Au bump or a metal bump constructed of a Ni film formed by an electroless plating method and an Au film with which its Ni film is covered can be used. The Au bump can be formed by, for example, a bonding method or a plating method.

Substantially the flat upper surface 32A of the internal connection terminal 32 can be formed by, for example, pressing the upper ends of the internal connection terminal 32 and the resin layer 33 by a flat plate to which a high pressure is applied after the resin layer 33 is formed so as to cover the internal connection terminal 32.

The resin layer 33 is disposed on the protective film 44 so as to cover the upper surface 32A of the internal connection terminal 32. An upper surface 33A of the resin layer 33 is formed so as to be substantially flush with the upper surface 32A of the internal connection terminal 32. As the resin layer 33, for example, a sheet-shaped resin having thermosetting properties (for example, an NCF (Non Conductive Film)), a pasty resin (for example, an NCP (Non Conductive Paste)) or an anisotropic conductive resin (for example, an ACF (Anisotropic Conductive Film)) can be used. A thickness of the resin layer 33 can be set at, for example, 10 μm to 60 μm. In the case of using the sheet-shaped resin having thermosetting properties, for example, 180° C. can be used as a heating temperature in the case of curing the resin layer 33.

The wiring pattern 35 is disposed on the upper surface 32A of the internal connection terminal 32 and the upper surface 33A of the resin layer 33. Consequently, the wiring pattern 35 is electrically connected to the internal connection terminal 32. The wiring pattern 35 has a connection part 48 and a pad 49 for inspection. The connection part 48 is electrically connected to metal wires 16, 17 through the diffusion preventive film 38. The pad 49 for inspection is placed in a position spaced from the connection part 48. The pad 49 for inspection is a pad for test on which a probe pin disposed in a probe apparatus is abutted in the case of inspecting the semiconductor apparatus 12-1 using the probe apparatus (not shown) which is an inspection apparatus for making electrical and functional inspections. In addition, the functional inspection refers to an inspection such as an action check of the semiconductor integrated circuit 42 disposed in the semiconductor chip 31 (for example, a check of the presence or absence of a reading error)).

By disposing the pad 49 for inspection on which the probe pin of the probe apparatus is abutted in the case of making the electrical inspection of the semiconductor apparatus 12-1 in the wiring pattern 35 electrically connected to the internal connection terminal 32 thus, the probe pin does not damage the connection part 48, so that reliability of electrical connection between the wiring pattern 35 and metal wires 16 to 18 can be improved.

As a material of the wiring pattern 35 constructed above, for example, a Cu film can be used. In the case of using Cu as the material of the wiring pattern 35, a thickness of the wiring pattern 35 can be set at, for example, 5 μm to 15 μm.

The dummy pattern 36 is disposed on the upper surface 33A of the resin layer 33 of the portion in which the wiring pattern 35 is not disposed. The dummy pattern 36 is constructed so as to have the same material as that of the wiring pattern 35 and become substantially the same thickness as that of the wiring pattern 35.

By disposing the dummy pattern 36 constructed by the same material as that of the wiring pattern 35 on the resin layer 33 of the portion in which the wiring pattern 35 is not disposed and setting a thickness of the dummy pattern 36 at substantially the same thickness as that of the wiring pattern 35 thus, warpage occurring in the semiconductor apparatus 12-1 can be reduced. Consequently, stacking the semiconductor apparatus 12-1 to the wiring substrate 11 is facilitated.

The solder resist 37 is disposed on the upper surface 33A of the resin layer 33 so as to cover the dummy pattern 36 and the wiring pattern 35 of the portion excluding the connection part 48 and the pad 49 for inspection. The solder resist 37 has an opening part for exposing an upper surface of the connection part 48 and an opening part for exposing an upper surface of the pad 49 for inspection.

The diffusion preventive film 38 is disposed on the connection part 48 and the pad 49 for inspection. The metal wire 16 electrically connected to the pad 23 of the wiring substrate 11 and the metal wire 17 electrically connected to the semiconductor apparatus 12-2 are connected to the diffusion preventive film 38. Consequently, wire bonding connection to the semiconductor apparatus 12-2 and the wiring substrate 11 is made in the semiconductor apparatus 12-1. As the diffusion preventive film 38, for example, an Ni/Au film in which an Ni layer and an Au layer are sequentially provided on the connection part 48 and the pad 49 for inspection can be used. In the case of using the Ni/Au film as the diffusion preventive film 38, a thickness of the Ni layer can be set at, for example, 2 μm to 5 μm. In this case, a thickness of the Au layer can be set at, for example, 1 μm.

The semiconductor apparatus 12-1 constructed above is glued on the solder resist 24 of the wiring substrate 11 by a sticky sheet 51 (concretely, for example, a die attach film) stuck on a lower surface 41B of the semiconductor substrate 41. The semiconductor apparatus 12-1 is a semiconductor apparatus (KGD (Known Good Die)) judged as a good item in electrical and functional inspections made before being glued on the wiring substrate 11.

The semiconductor apparatus 12-2 has a configuration similar to that of the semiconductor apparatus 12-1. The semiconductor apparatus 12-2 is glued on the solder resist 37 of the semiconductor apparatus 12-1 by a sticky sheet 51 stuck on a lower surface of a semiconductor substrate 41. The semiconductor apparatus 12-2 is stepwise placed on the semiconductor apparatus 12-1 so as to expose the diffusion preventive film 38 disposed on the connection part 48 of the semiconductor apparatus 12-1. A diffusion preventive film 38 disposed on a connection part 48 of the semiconductor apparatus 12-2 is electrically connected to the semiconductor apparatuses 12-1, 12-3 through the metal wires 17, 18. That is, wire bonding connection between the semiconductor apparatus 12-2 and the semiconductor apparatuses 12-1, 12-3 is made.

The semiconductor apparatus 12-2 constructed above is a semiconductor apparatus (KGD (Known Good Die)) judged as a good item in electrical and functional inspections made before being glued on the semiconductor apparatus 12-1.

The semiconductor apparatus 12-3 has a configuration similar to that of the semiconductor apparatus 12-1. The semiconductor apparatus 12-3 is glued on a solder resist 37 of the semiconductor apparatus 12-2 by a sticky sheet 51 stuck on a lower surface of a semiconductor substrate 41. The semiconductor apparatus 12-3 is stepwise placed on the semiconductor apparatus 12-2 so as to expose a diffusion preventive film 38 disposed on a connection part 48 of the semiconductor apparatus 12-2. A diffusion preventive film 38 disposed on a connection part 48 of the semiconductor apparatus 12-3 is electrically connected to the semiconductor apparatus 12-2 through the metal wire 18. That is, wire bonding connection between the semiconductor apparatus 12-3 and the semiconductor apparatus 12-2 is made.

The semiconductor apparatus 12-3 constructed above is a semiconductor apparatus (KGD (Known Good Die)) judged as a good item in electrical and functional inspections made before being glued on the semiconductor apparatus 12-2. The semiconductor apparatuses 12-1 to 12-3 are stepwise stacked.

By stepwise stacking the semiconductor apparatuses 12-1 to 12-3 previously judged as the good items on the wiring substrate 11 while having the resin layers 33 which are disposed on surfaces of the semiconductor chips 31 in which the electrode pads 43 are formed and expose the internal connection terminals 32 placed on the electrode pads 43 and the wiring patterns 35 which are disposed on the resin layers 33 and are connected to the internal connection terminals 32 thus, a yield of the electronic apparatus 10 can be improved.

Also, since a load by packaging processing of a high pressure or a high temperature, etc. at the time of forming the wiring pattern 35 and the resin layer 33 is applied to the semiconductor chips 31 disposed in the plurality of semiconductor apparatuses 12-1 to 12-3 previously judged as the good items before the sealing resin 13 is formed, the semiconductor chips 31 disposed in the plurality of semiconductor apparatuses 12-1 to 12-3 judged as the good items become resistant to breakage, so that a yield of the electronic apparatus 10 can be improved.

The sealing resin 13 is disposed on the wiring substrate 11 so as to seal the metal wires 16 to 18 and the semiconductor apparatuses 12-1 to 12-3 stacked. As the sealing resin 13, for example, a molding resin (for example, an epoxy resin) having thermosetting properties can be used.

The external connection terminal 14 is arranged on the pad 27 for external connection of the wiring substrate 11. The external connection terminal 14 is a terminal electrically connected to a mounting substrate (not shown) such as a motherboard. As the external connection terminal 14, for example, a solder bump can be used.

According to the electronic apparatus of the embodiment, by stepwise stacking the semiconductor apparatuses 12-1 to 12-3 (KGD (Known Good Die)) previously judged as the good items on the wiring substrate 11 while having the resin layers 33 which are disposed on surfaces of the semiconductor chips 31 in which the electrode pads 43 are formed and expose the internal connection terminals 32 placed on the electrode pads 43 and the wiring patterns 35 which are disposed on the resin layers 33 and are connected to the internal connection terminals 32, a yield of the electronic apparatus 10 can be improved.

Also, since a load by packaging processing of a high pressure or a high temperature, etc. at the time of forming the wiring pattern 35 and the resin layer 33 is applied to the semiconductor chips 31 disposed in the plurality of semiconductor apparatuses 12-1 to 12-3 previously judged as the good items before the sealing resin 13 is formed, the semiconductor chips 31 disposed in the plurality of semiconductor apparatuses 12-1 to 12-3 previously judged as the good items become resistant to breakage by influence of a pressure or a temperature, etc. at the time of forming the sealing resin 13, so that a yield of the electronic apparatus 10 can be improved.

FIGS. 9 to 24 are diagrams showing manufacturing steps of the electronic apparatus according to the embodiment of the invention. In FIGS. 9 to 24, the same numerals are assigned to the same components as those of the electronic apparatus 10 of the embodiment. Also, in FIGS. 9 to 17, B shows a position (hereinafter called a "cut position B") in which a dicer or a slicer cuts a semiconductor substrate 61.

Figure 9:
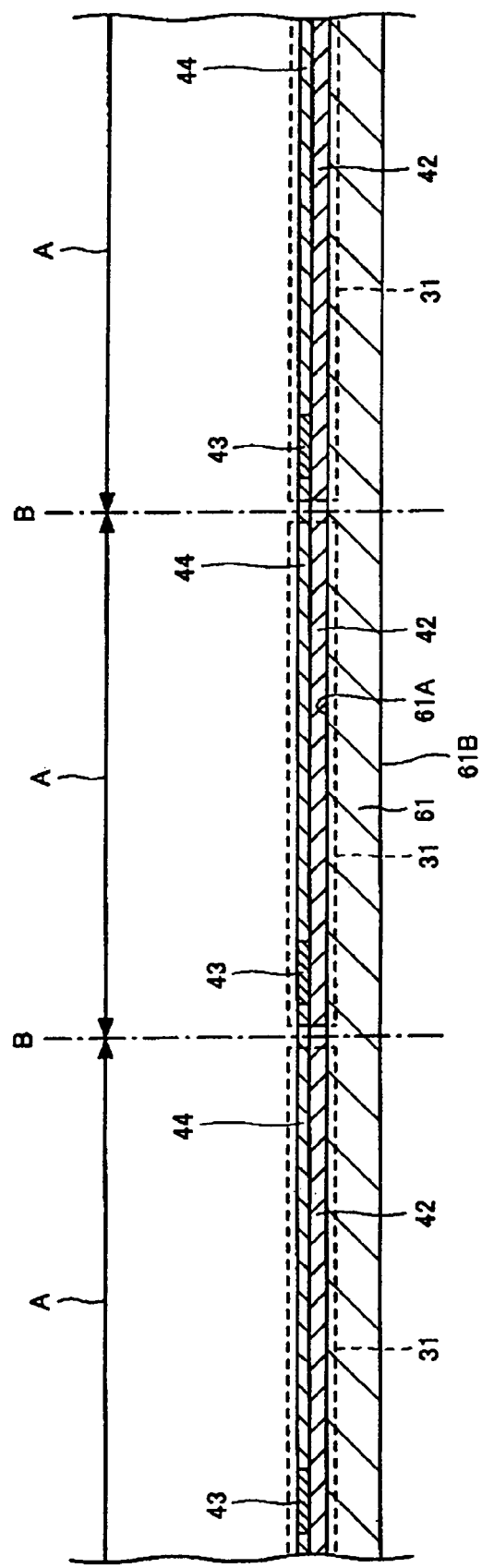
FIG. 9 is a diagram showing a manufacturing step of the electronic apparatus according to the embodiment of the invention (first).

First, in a step shown in FIG. 9, the semiconductor substrate 61 having a plurality of semiconductor apparatus formation regions A is prepared, and a semiconductor chip 31 having a semiconductor integrated circuit 42, an electrode pad 43 and a protective film 44 is formed on the side of an upper surface 61A of the semiconductor substrate 61 corresponding to the semiconductor apparatus formation region A by a well-known technique. The semiconductor apparatus formation region A is a region in which a semiconductor apparatus 12 is formed. The semiconductor apparatus 12 is a semiconductor apparatus having a configuration similar to that of the semiconductor apparatuses 12-1 to 12-3 (see FIG. 8) described above. The semiconductor substrate 61 results in the semiconductor substrate 41 (see FIG. 8) described above by being formed in a thin plate and being cut in the cut positions B in steps described below.

As the semiconductor substrate 61, for example, a silicon wafer can be used. A thickness of the semiconductor substrate 61 can be set at, for example, 500 μm to 775 μm. As a material of the electrode pad 43, for example, Al can be used. Also, as the protective film 44, for example, an SiN film or a PSG film can be used.

Figure 10:
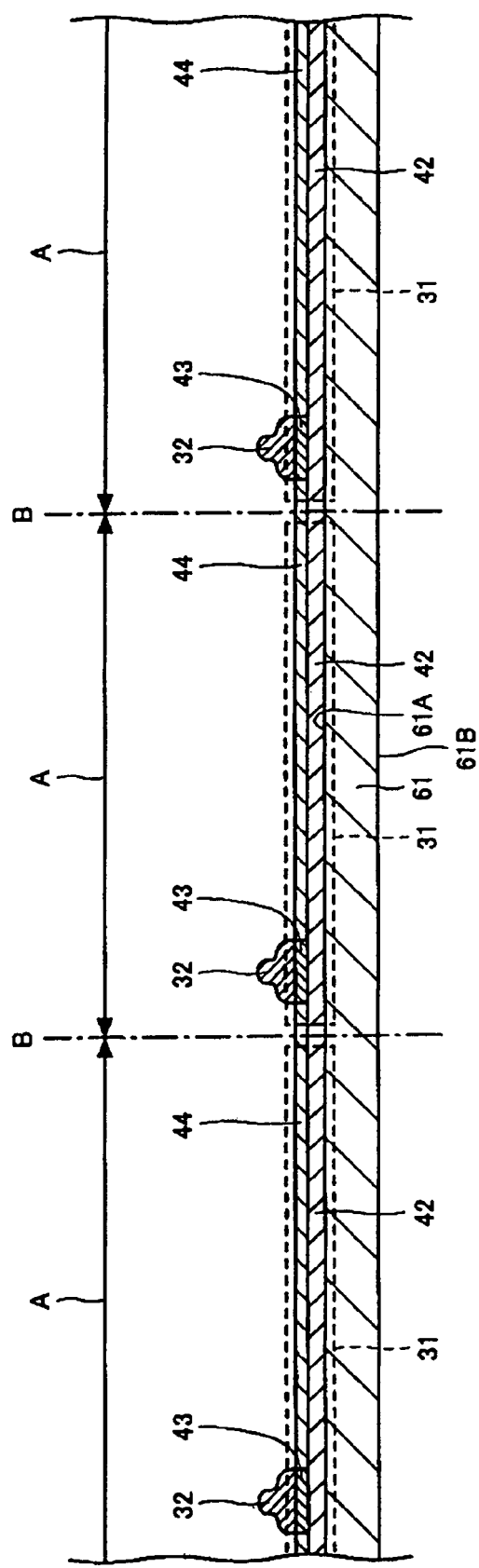
FIG. 10 is a diagram showing a manufacturing step of the electronic apparatus according to the embodiment of the invention (second).

Next, in a step shown in FIG. 10, one internal connection terminal 32 is respectively formed on all the electrode pads 43. As the internal connection terminal 32, for example, an Au bump or a metal bump constructed of a Ni film formed by an electroless plating method and an Au film with which its Ni film is covered can be used. The Au bump can be formed by, for example, a bonding method. In addition, variations in height may be present in the plurality of internal connection terminals 32 formed in the step shown in FIG. 10.

Figure 11:
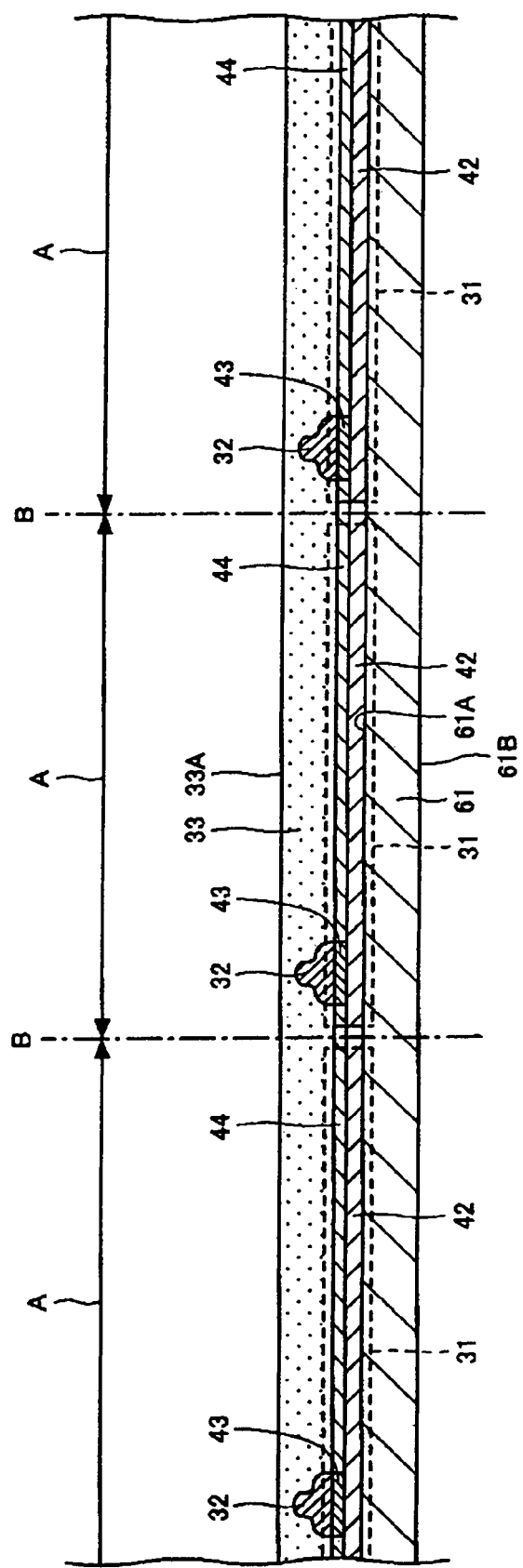
FIG. 11 is a diagram showing a manufacturing step of the electronic apparatus according to the embodiment of the invention (third).

Then, in a step shown in FIG. 11, a resin layer 33 is formed so as to cover the internal connection terminals 32 and the plurality of semiconductor chips 31 (the upper surface side of the plurality of semiconductor chips 31) of the side on which the internal connection terminals 32 are disposed. As the resin layer 33, a sheet-shaped resin having thermosetting properties and sticky properties (for example, an NCF (Non Conductive Film) ), a pasty resin having thermosetting properties (for example, an NCP (Non Conductive Paste)) or an anisotropic conductive resin (for example, an ACF (Anisotropic Conductive Film) ) can be used. In the case of using the sheet-shaped resin having thermosetting properties and sticky properties, the resin layer 33 is formed by sticking the sheet-shaped resin on the upper surface side of a structural body shown in FIG. 10. Also, in the case of using the pasty resin as the resin layer 33, a pasty resin is formed on the upper surface side of the structural body shown in FIG. 10 by a printing method etc. and thereafter is pre-baked and the resin is partially cured. This partially cured resin has adhesive properties. A thickness of the resin layer 33 can be set at, for example, 20 μm to 100 μm.

Figure 12:
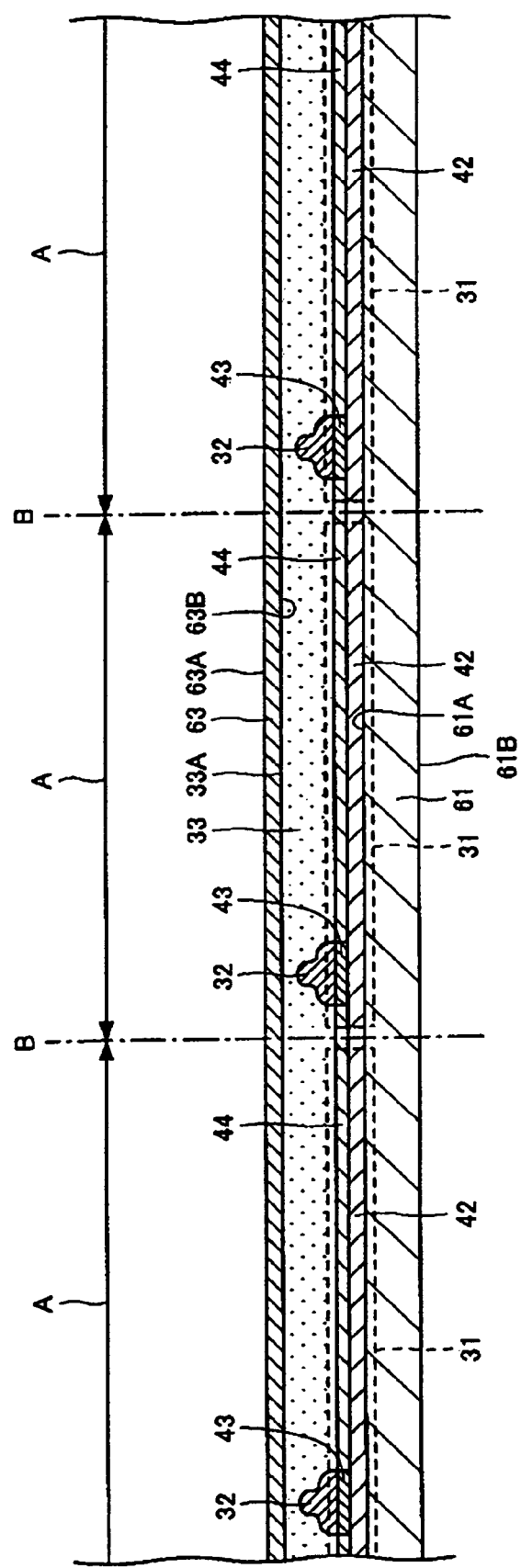
FIG. 12 is a diagram showing a manufacturing step of the electronic apparatus according to the embodiment of the invention (fourth).

Then, in a step shown in FIG. 12, a metal layer 63 is formed on an upper surface 33A of the resin layer 33. The metal layer 63 is etched and results in a wiring pattern 35 and a dummy pattern 36 in a step shown in FIG. 14 described below. Concretely, the metal layer 63 is formed on the upper surface 33A of the resin layer 33 by preparing Cu foil as the metal layer 63 and sticking this Cu foil on the upper surface 33A of the resin layer 33. A thickness of the metal layer 63 can be set at, for example, 5 μm to 15 μm.

Figure 13:
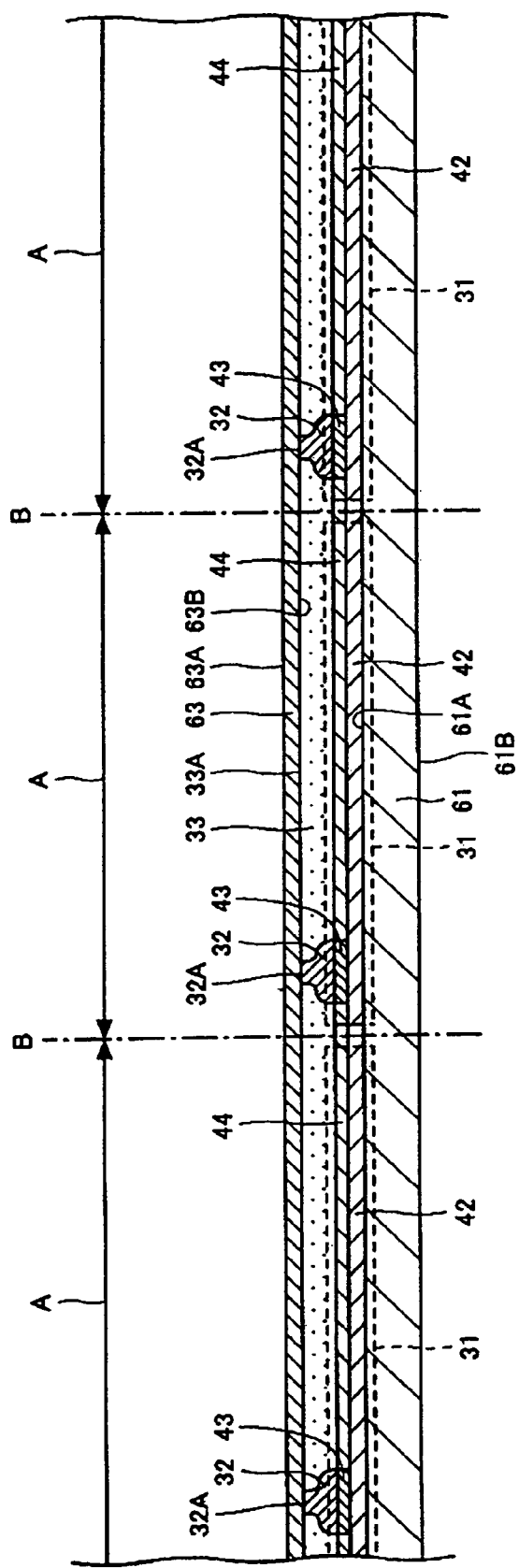
FIG. 13 is a diagram showing a manufacturing step of the electronic apparatus according to the embodiment of the invention (fifth).

Then, in a step shown in FIG. 13, in a state of heating a structural body shown in FIG. 12 (a heating temperature is, for example, 180° C.), a flat plate (not shown) is placed on the metal layer 63 and the metal layer 63 is pressed from the side of an upper surface 63A of the metal layer 63 through the flat plate (a pressure is, for example, 1.5 MPa to 3.0 MPa) and a lower surface 63B of the metal layer 63 is brought into contact with upper surfaces 32A of the plurality of internal connection terminals 32 and the metal layer is crimped on the internal connection terminals 32. Also, the resin layer 33 cures by heating the structural body shown in FIG. 12. A thickness of the resin layer 33 after crimping can be set at, for example, 10 μm to 60 μm.

Figure 14:
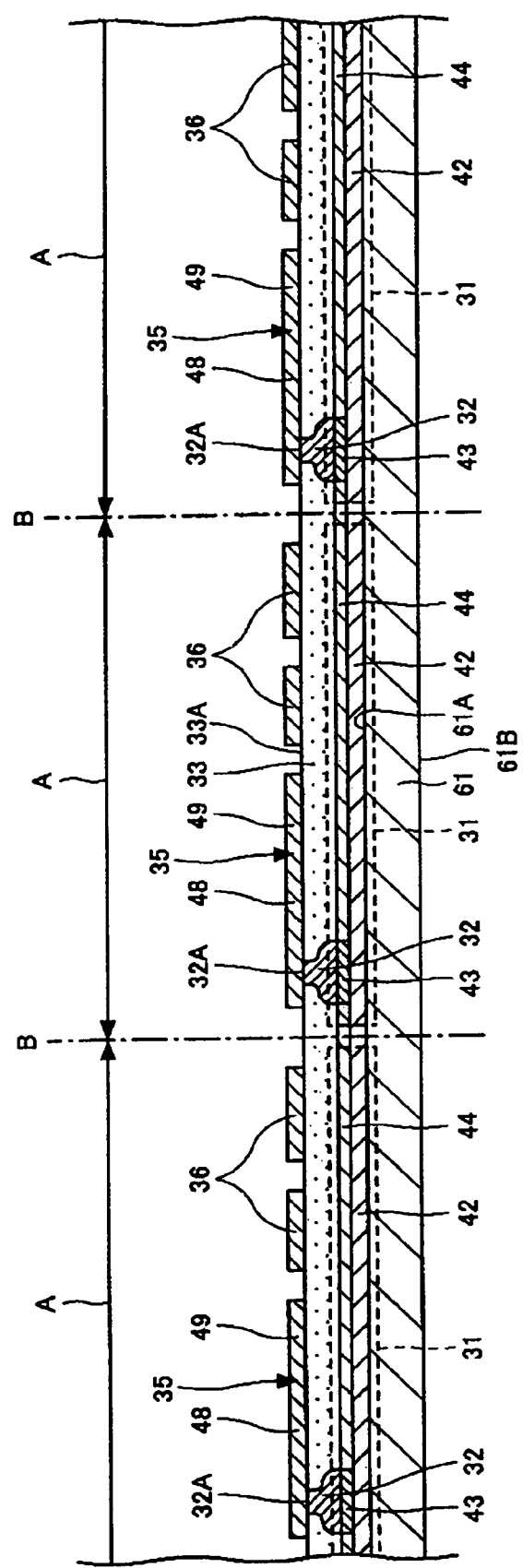
FIG. 14 is a diagram showing a manufacturing step of the electronic apparatus according to the embodiment of the invention (sixth).

Then, in a step shown in FIG. 14, the metal layer 63 is patterned by etching and wiring patterns 35 and dummy patterns 36 are simultaneously formed and thereafter, roughening treatment of the wiring patterns 35 and the dummy patterns 36 is performed. Concretely, a resist film patterned is formed on the metal layer 63 and then using this resist film as a mask, the metal layer 63 is etched and the wiring patterns 35 and the dummy patterns 36 are formed.

By simultaneously forming the wiring patterns 35 and the dummy patterns 36 thus, the manufacturing steps can be simplified as compared with the case of separately forming the wiring patterns 35 and the dummy patterns 36.

The roughening treatment of the wiring patterns 35 and the dummy patterns 36 can be performed by any method of blackening treatment or roughening etching treatment. The roughening treatment is treatment for improving adhesion between the wiring patterns 35 and the dummy patterns 36 and a solder resist 37 formed on side surfaces and upper surfaces of the wiring patterns 35 and the dummy patterns 36.

Figure 15:
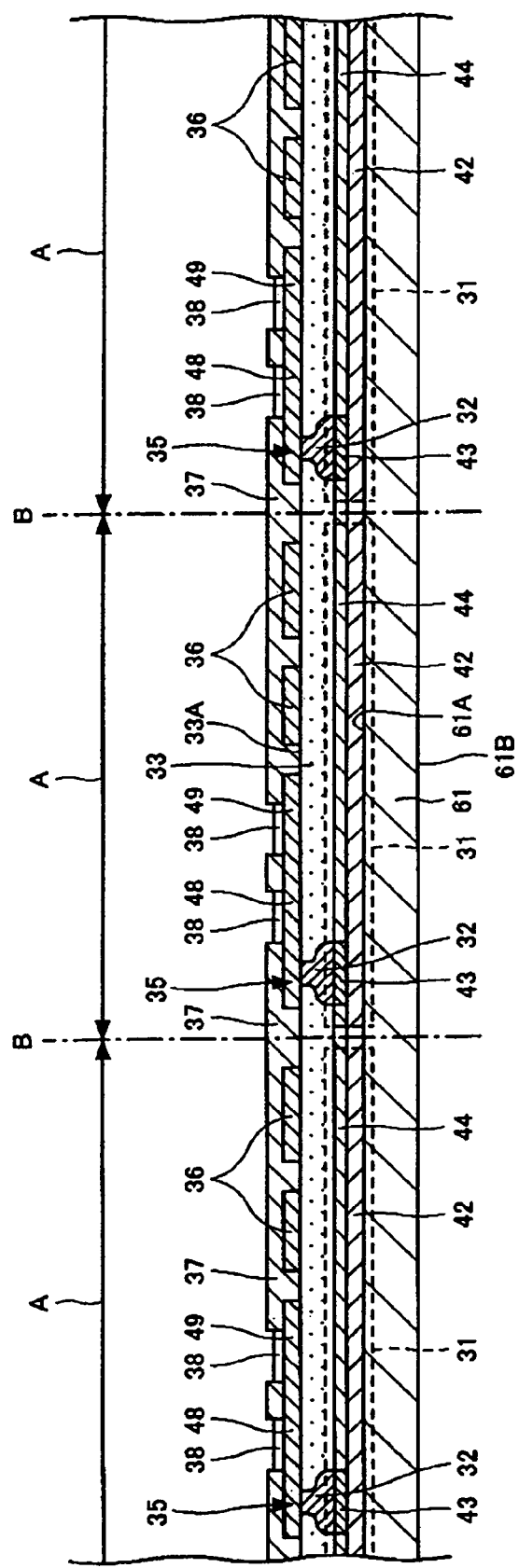
FIG. 15 is a diagram showing a manufacturing step of the electronic apparatus according to the embodiment of the invention (seventh).

Then, in a step shown in FIG. 15, the solder resist 37 is disposed on the upper surface 33A of the resin layer 33 so as to cover the dummy patterns 36 and the wiring patterns 35 of the portion excluding connection parts 48 and pads 49 for inspection and thereafter, a diffusion preventive film 38 is formed on the connection parts 48 and the pads 49 for inspection. The diffusion preventive film 38 can be formed by, for example, a plating method. As the diffusion preventive film 38, for example, an Ni/Au film in which an Ni layer and an Au layer are sequentially provided on the connection parts 48 and the pads 49 for inspection can be used. In the case of using the Ni/Au film as the diffusion preventive film 38, a thickness of the Ni layer can be set at, for example, 2 μm to 5 μm. In this case, a thickness of the Au layer can be set at, for example, 1 μm.

Figure 16:
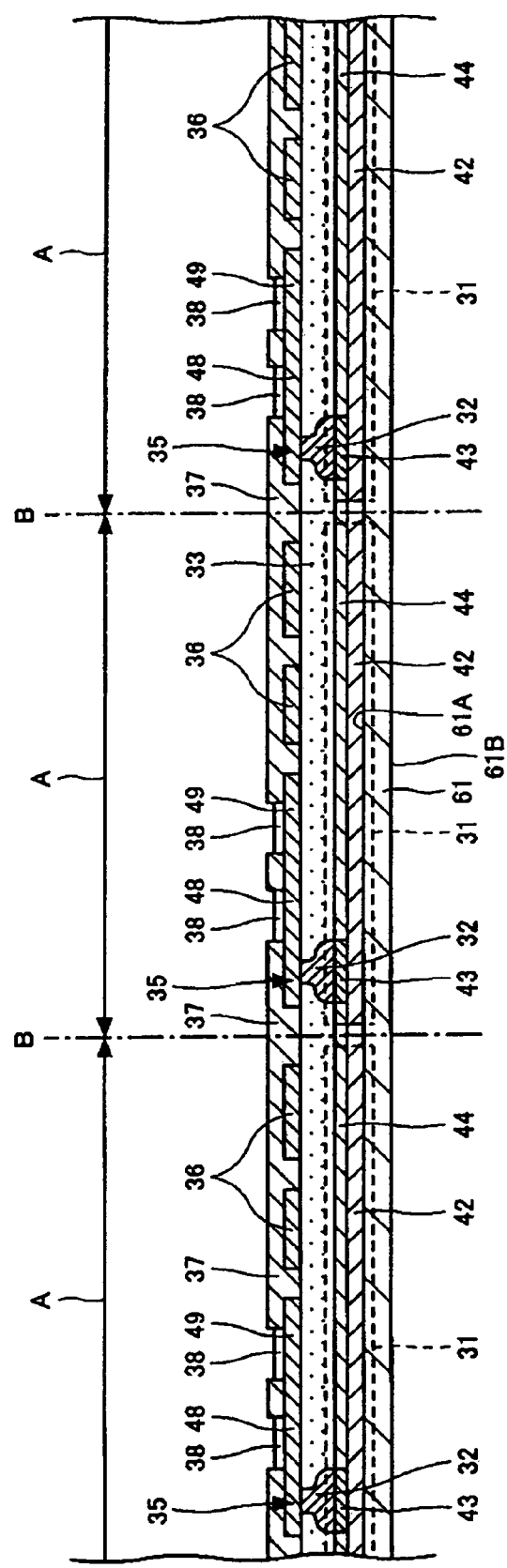
FIG. 16 is a diagram showing a manufacturing step of the electronic apparatus according to the embodiment of the invention (eighth).

Then, in a step shown in FIG. 16, the semiconductor substrate 61 is polished or ground from the side of a lower surface 61B of the semiconductor substrate 61 and the semiconductor substrate 61 is formed in a thin plate. In the thin plate formation of the semiconductor substrate 61, for example, a back side grinder can be used. A thickness of the semiconductor substrate 61 after the thin plate formation can be set at, for example, 50 μm to 100 μm.

Figure 17:
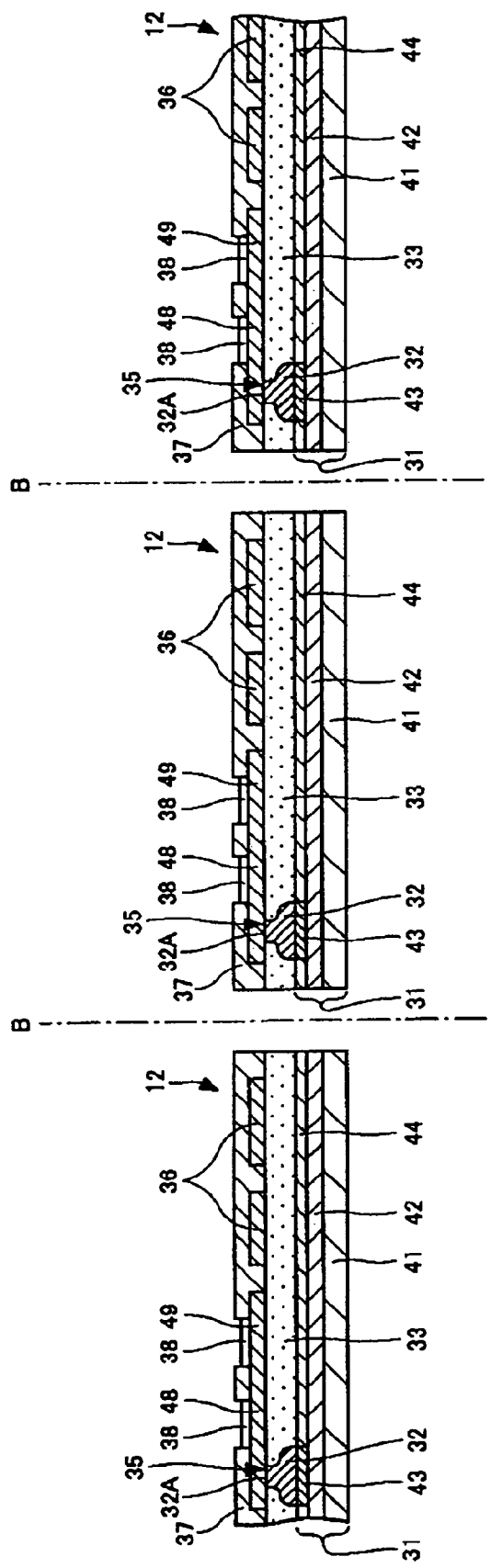
FIG. 17 is a diagram showing a manufacturing step of the electronic apparatus according to the embodiment of the invention (ninth).

Then, in a step shown in FIG. 17, the semiconductor substrate 61 formed in the thin plate is cut along the cut positions B. Consequently, a plurality of semiconductor apparatuses 12 are manufactured (the steps shown in FIGS. 9 to 17 correspond to a semiconductor apparatus formation step). The plurality of semiconductor apparatuses 12 are semiconductor apparatuses having configurations similar to those of the semiconductor apparatuses 12-1 to 12-3 described above and also are the semiconductor apparatuses before electrical and functional inspections are made. In addition, the electrical and functional inspections of the semiconductor apparatuses 12 may be made before the semiconductor apparatuses 12 are individualized.

Figure 18:
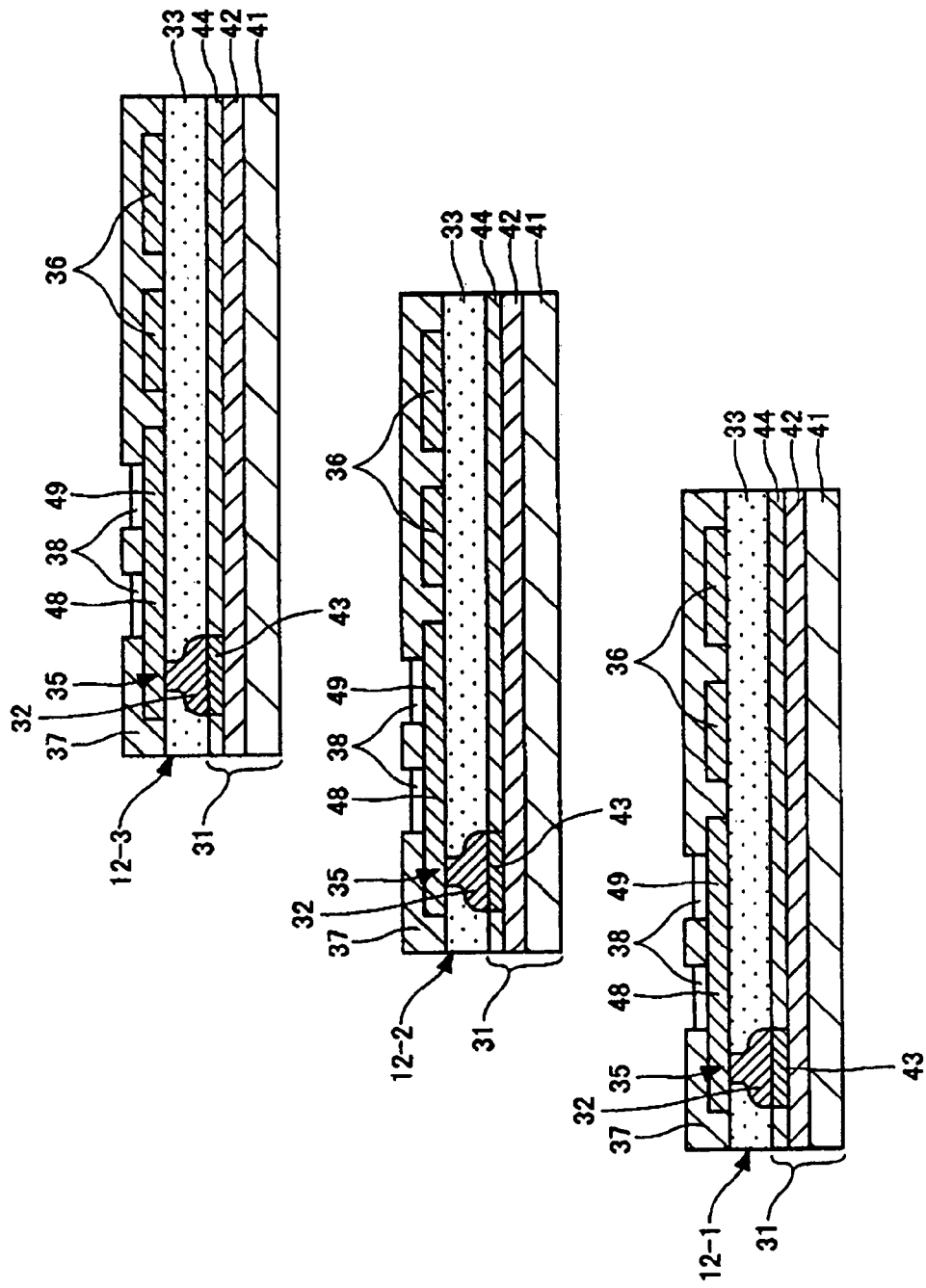
FIG. 18 is a diagram showing a manufacturing step of the electronic apparatus according to the embodiment of the invention (tenth).

Then, in a step shown in FIG. 18, using a probe apparatus (not shown), a probe pin is brought into contact with the diffusion preventive film 38 disposed on the pad 49 for inspection of the semiconductor apparatus 12 shown in FIG. 17 and the electrical and functional inspections of the plurality of semiconductor apparatuses 12 and the semiconductor apparatuses 12-1 to 12-3 (KGD (Known Good Die)) judged as good items are acquired (a good item semiconductor apparatus acquisition step).

Figure 19:
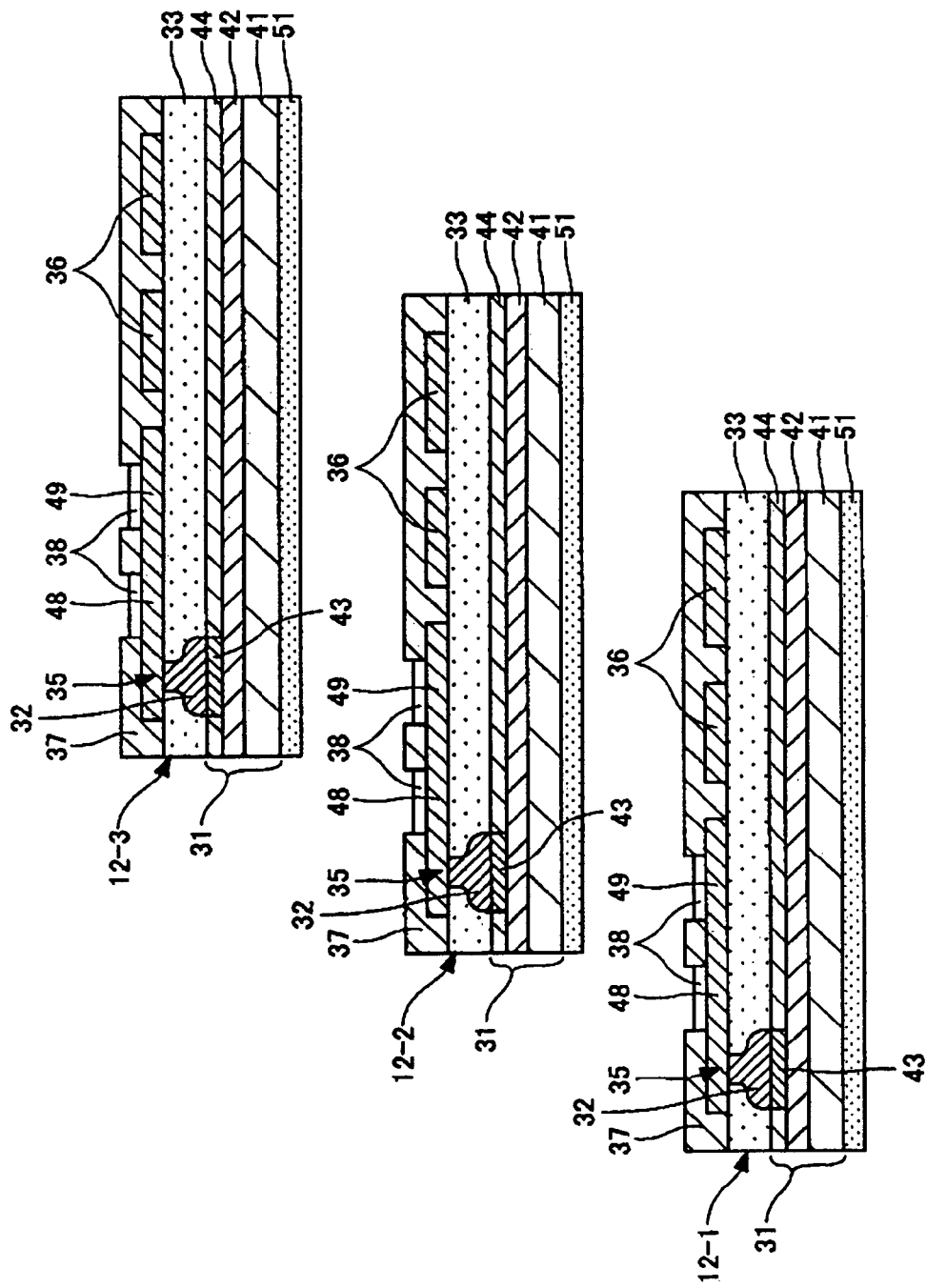
FIG. 19 is a diagram showing a manufacturing step of the electronic apparatus according to the embodiment of the invention (eleventh).

Then, in a step shown in FIG. 19, sticky tapes 51 are stuck on lower surfaces 41B of semiconductor substrates 41 disposed in the semiconductor apparatuses 12-1 to 12-3 judged as the good items in the step shown in FIG. 18. As the sticky tape 51, for example, a die attach film can be used. The sticky tape 51 may be stuck on the lower surface 41B of the semiconductor substrate 41 disposed in the semiconductor apparatus 12 before individualization. In this case, the sticky tape 51 is cut together with the semiconductor substrate 61 formed in the thin plate.

Figure 20:
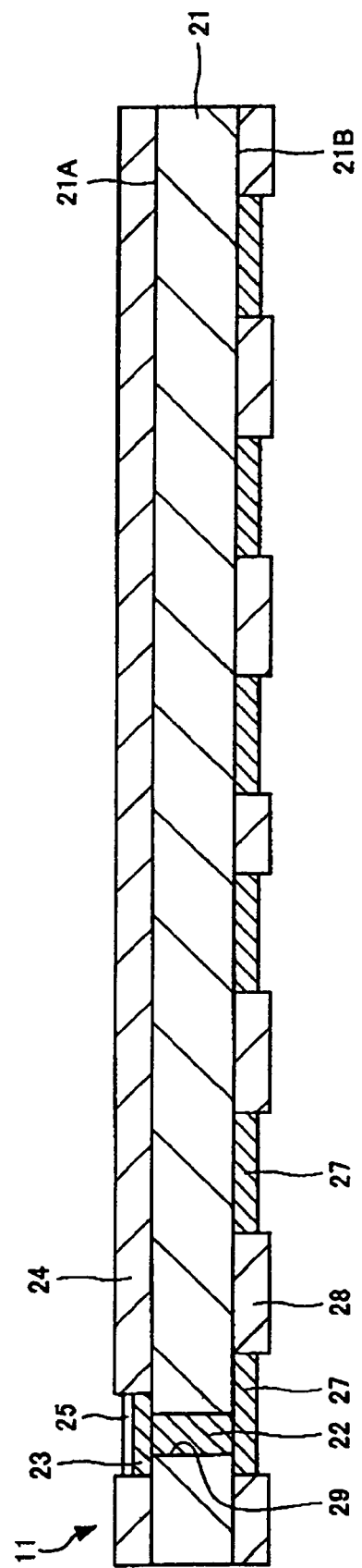
FIG. 20 is a diagram showing a manufacturing step of the electronic apparatus according to the embodiment of the invention (twelfth).

Then, in a step shown in FIG. 20, a wiring substrate 11 is formed by a well-known technique. Then, in a step shown in FIG. 21, the semiconductor apparatuses 12-1 to 12-3 judged as the good items are sequentially stacked stepwise on the wiring substrate 11 shown in FIG. 20 (a semiconductor apparatus stacking step).

At this time, the semiconductor apparatus 12-2 stepwise stacked on the semiconductor apparatus 12-1 is placed so as to expose the diffusion preventive film 38 disposed on the connection part 48 of the semiconductor apparatus 12-1, and the semiconductor apparatus 12-3 stepwise stacked on the semiconductor apparatus 12-2 is placed so as to expose the diffusion preventive film 38 disposed on the connection part 48 of the semiconductor apparatus 12-2.

Figure 21:
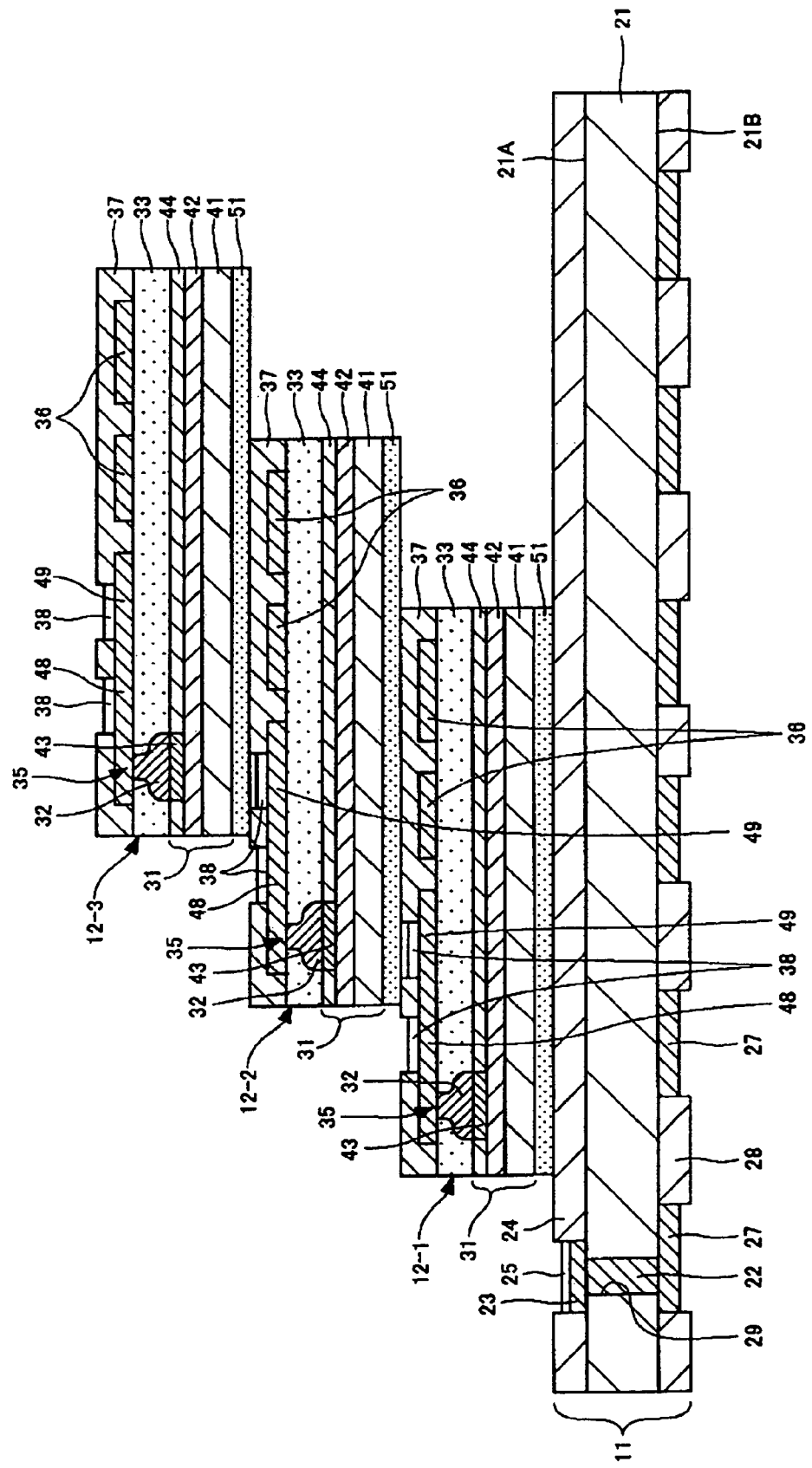
FIG. 21 is a diagram showing a manufacturing step of the electronic apparatus according to the embodiment of the invention (thirteenth).
Figure 22:
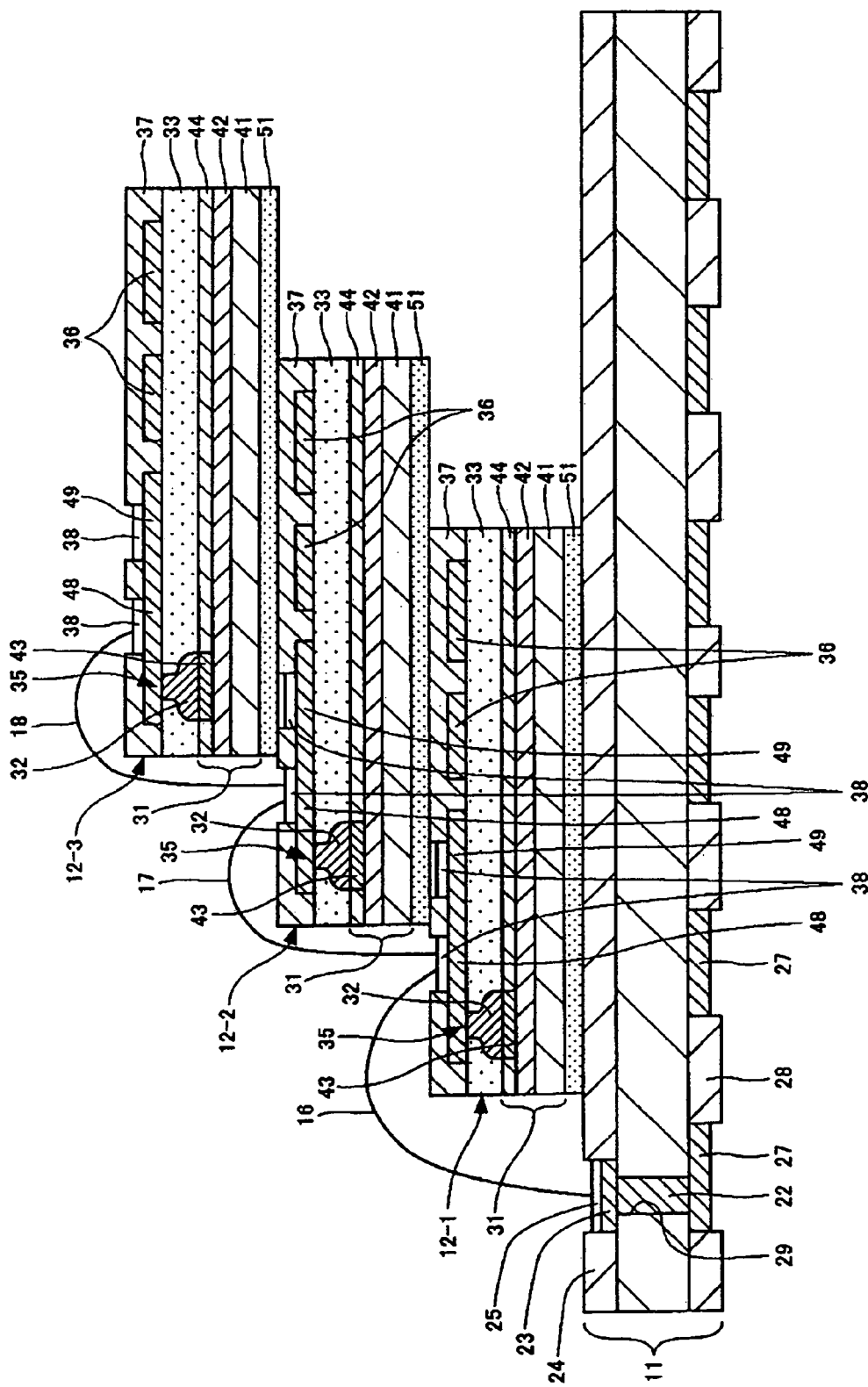
FIG. 22 is a diagram showing a manufacturing step of the electronic apparatus according to the embodiment of the invention (fourteenth).

Then, in a step shown in FIG. 22, electrical connection (wire bonding connection) between the wiring substrate 11 shown in FIG. 21 and the semiconductor apparatuses 12-1 to 12-3 judged as the good items are made by metal wires 16 to 18 (an electrical connection step).

Figure 23:
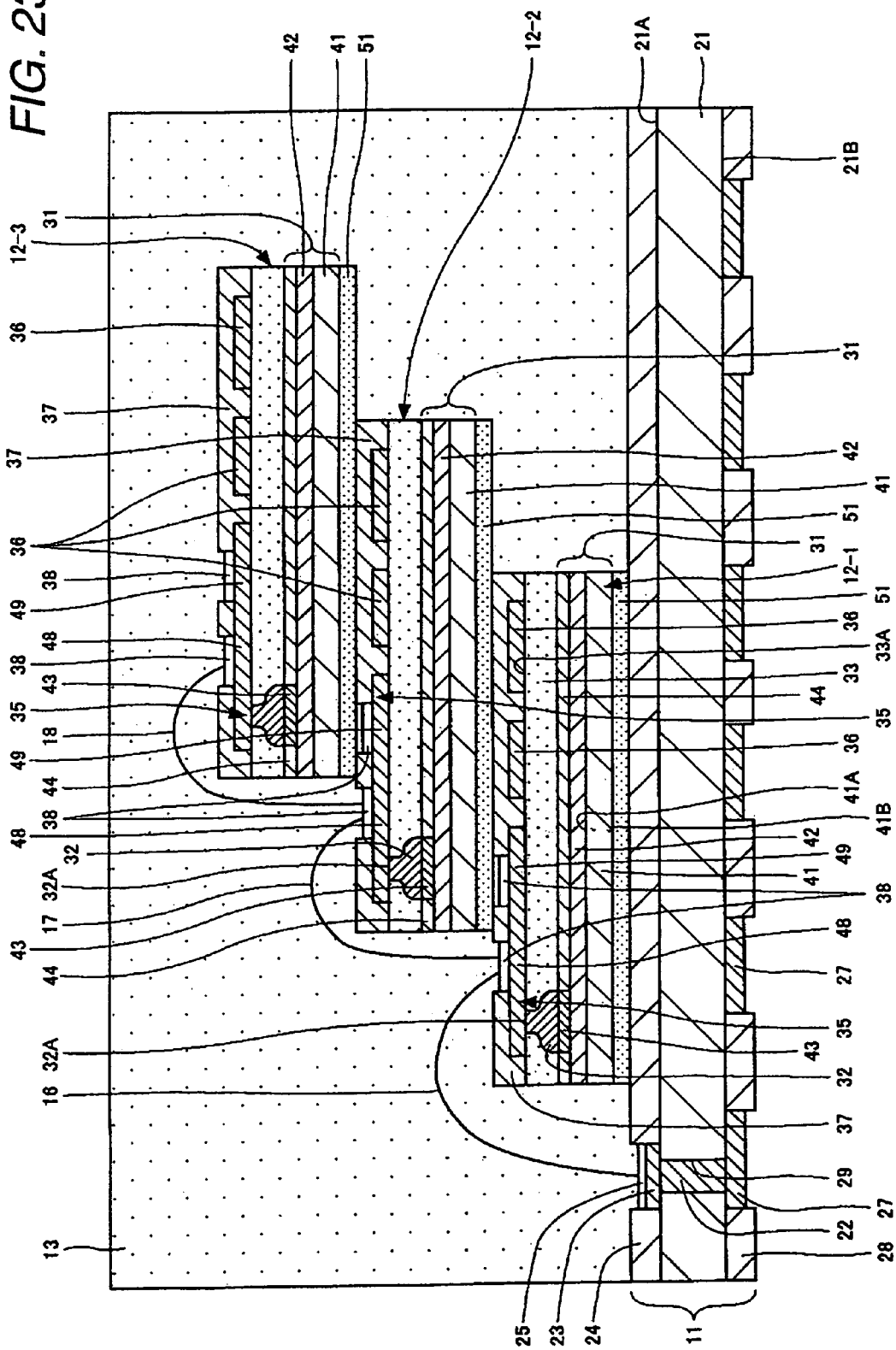
FIG. 23 is a diagram showing a manufacturing step of the electronic apparatus according to the embodiment of the invention (fifteenth).

Then, in a step shown in FIG. 23, a sealing resin 13 for sealing the metal wires 16 to 18 and the semiconductor apparatuses 12-1 to 12-3 judged as the good items shown in FIG. 22 is formed (a sealing resin formation step). As the sealing resin 13, for example, a molding resin (for example, an epoxy resin) having thermosetting properties can be used. Concretely, in the case of using the molding resin having thermosetting properties as the sealing resin 13, a structural body shown in FIG. 22 is received inside a metal mold and the molding resin to which a pressure (for example, 5 MPa to 10 MPa) is applied is introduced into the metal mold and thereafter the molding resin is heated (a heating temperature is, for example, 180° C.) and cured and thereby, the sealing resin 13 is formed. Since the high heat and the high pressure have already been applied to the semiconductor apparatuses 12-1 to 12-3 judged as the good items in the step shown in FIG. 13 described above, the semiconductor chips 31 disposed in the semiconductor apparatuses 12-1 to 12-3 judged as the good items are not broken in a packaging processing process including the subsequent sealing resin formation step.

Figure 24:
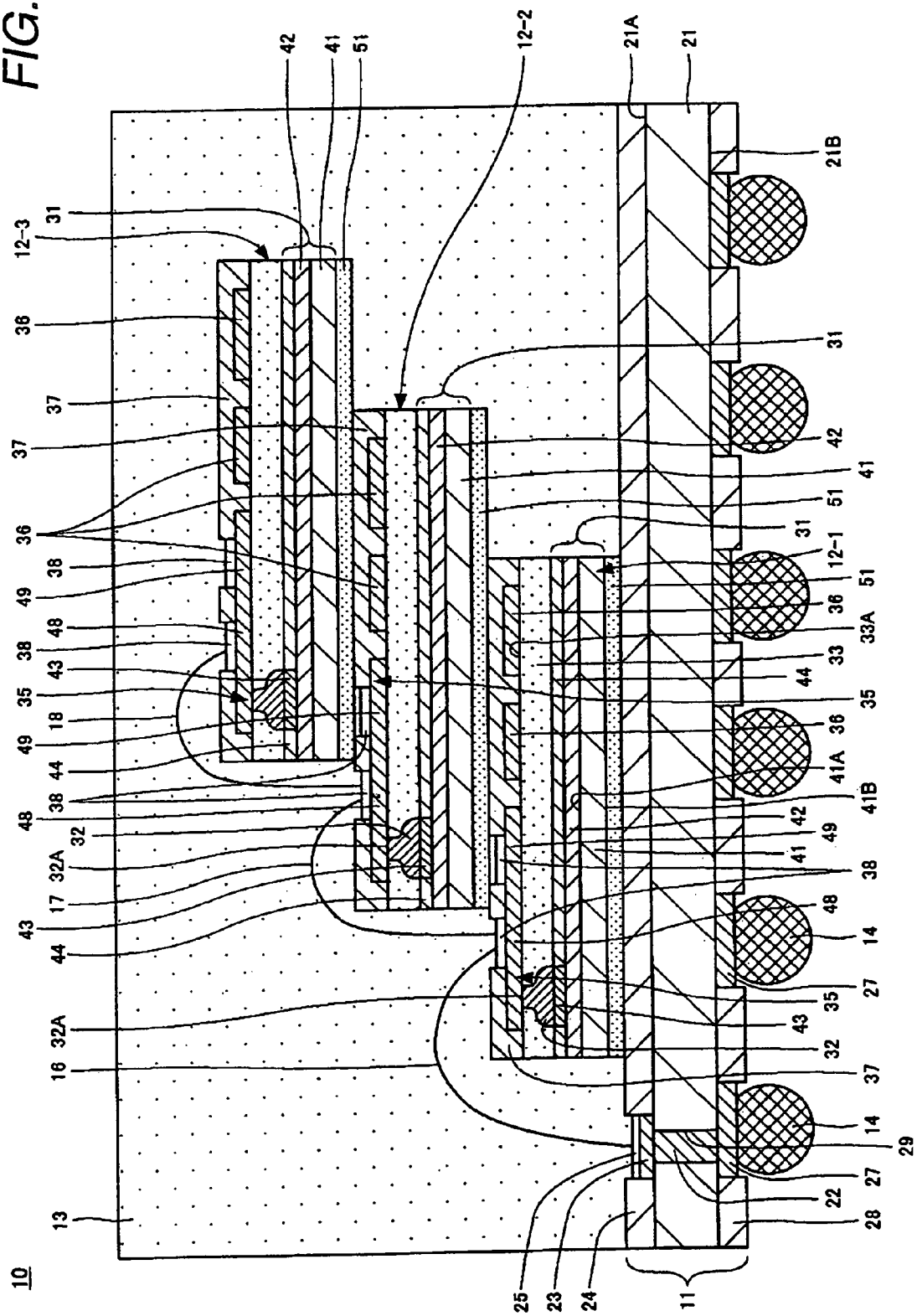
FIG. 24 is a diagram showing a manufacturing step of the electronic apparatus according to the embodiment of the invention (sixteenth).

Then, in a step shown in FIG. 24, external connection terminals 14 are formed on pads 27 for external connection of a structural body shown in FIG. 23. Consequently, an electronic apparatus 10 of the embodiment is manufactured. As the external connection terminal 14, for example, a solder bump can be used.

According to the manufacturing method of the electronic apparatus of the embodiment, electrical and functional inspections of the plurality of semiconductor apparatuses 12 having the resin layers 33 which are disposed on surfaces of the semiconductor chips 31 in which the electrode pads 43 are formed and expose the internal connection terminals 32 and the wiring patterns 35 which are disposed on the resin layers 33 and are connected to the internal connection terminals 32 are made and the plurality of semiconductor apparatuses 12-1 to 12-3 (KGD (Known Good Die)) judged as good items are acquired and the semiconductor apparatuses 12-1 to 12-3 previously judged as the good items are stacked on the wiring substrate 11 and then electrical connection between the wiring substrate 11 and the stacked semiconductor apparatuses 12-1 to 12-3 are made and thereafter the semiconductor apparatuses 12-1 to 12-3 are sealed with the sealing resin 13 and thereby, a yield of the electronic apparatus 10 can be improved.

Also, since a high pressure or a high temperature, etc. at the time of forming the wiring pattern 35 and the resin layer 33 is applied to the semiconductor chips 31 disposed in the plurality of semiconductor apparatuses 12-1 to 12-3 previously judged as the good items before the sealing resin 13 is formed, the semiconductor chips 31 disposed in the plurality of semiconductor apparatuses 12-1 to 12-3 previously judged as the good items become resistant to breakage by influence of a pressure or a temperature, etc. at the time of forming the sealing resin 13, so that a yield of the electronic apparatus 10 can be improved.

The preferred embodiment of the invention has been described above in detail, but the invention is not limited to such a specific embodiment and various modifications and changes can be made within the gist of the invention described in the claims. For example, in the embodiment, the case of stacking the semiconductor apparatuses 12-1 to 12-3 comprising the semiconductor chips 31 of the same kind on the wiring substrate 11 has been described by way of example, but a plurality of semiconductor apparatuses comprising semiconductor chips of different kinds may be stacked on the wiring substrate 11 and may be sealed with the sealing resin 13.

Also, in the embodiment, the case of stacking three semiconductor apparatuses (semiconductor apparatuses 12-1 to 12-3) on the wiring substrate 11 has been described by way of example, but the number of semiconductor apparatuses stacked on the wiring substrate 11 may be two or three or more.

Also, as shown in FIG. 11, in the case where the semiconductor apparatuses 12-1 to 12-3 in which the upper ends of the internal connection terminals 32 are exposed and thereafter the wiring patterns 35 and the dummy patterns 36 are formed on the resin layers 33 are disposed in the electronic apparatus 10, an effect similar to that of the embodiment can be obtained. That is, the manufacturing method of the semiconductor apparatuses 12-1 to 12-3 disposed in the electronic apparatus 10 is not limited to the steps shown in FIGS. 9 to 17.

The invention can be applied to an electronic apparatus comprising a plurality of semiconductor chips (KGD (Known Good Die)) stacked on a wiring substrate and a sealing resin with which the plurality of semiconductor chips (KGD (Known Good Die)) are sealed, and a manufacturing method of the electronic apparatus.

What is claimed is:

1. A manufacturing method of an electronic apparatus comprising a plurality of semiconductor apparatuses, a wiring substrate on which the plurality of semiconductor apparatuses are stacked, and a sealing resin with which the plurality of semiconductor apparatuses stacked on the wiring substrate are sealed, comprising:

a semiconductor apparatus formation step of forming the plurality of semiconductor apparatuses;

a good item semiconductor apparatus acquisition step of making an action check of the plurality of semiconductor apparatuses and acquiring a plurality of semiconductor apparatuses judged as good items;

a semiconductor apparatus stacking step of stepwise stacking the plurality of semiconductor apparatuses judged as the good items on the wiring substrate;

an electrical connection step of making electrical connection between the wiring substrate and the plurality of semiconductor apparatuses judged as the good items after the semiconductor apparatus stacking step; and a sealing resin formation step of sealing the plurality of semiconductor apparatuses judged as the good items with the sealing resin after the electrical connection step, wherein the semiconductor apparatus formation step includes a step of forming semiconductor chips having electrode pads on semiconductor apparatus formation regions of a semiconductor substrate, a step of forming internal connection terminals on the electrode pads, a step of forming a resin layer on the semiconductor substrate so as to cover the internal connection terminals, a step of forming a metal layer on the resin layer, a step of pressing the metal layer to compress the resin layer and to deform the internal connection terminals so that an upper surface of the resin layer is substantially flush with and exposes upper surfaces of the internal connection terminals, a step of crimping the metal layer on the internal connection terminals by heating, and a step of forming a wiring pattern having a connection part, to which a metal wire is connected, and an inspection pad for making an action check of the semiconductor apparatus, the inspection pad placed in a position spaced from the connection part, and a dummy pattern at the same time by patterning the metal layer by etching after crimping.

2. A manufacturing method of an electronic apparatus according to claim 1, wherein the semiconductor apparatus stacking step further comprises stepwise stacking one of the plurality of semiconductor apparatuses on another one of the plurality of semiconductor apparatuses such that the one of the plurality of semiconductor apparatuses covers the dummy pattern portion of the other one of the plurality of semiconductor apparatuses.

* * * * *